US012639495B2

(12) United States Patent
Bryant

(10) Patent No.: US 12,639,495 B2
(45) Date of Patent: May 26, 2026

(54) SYSTEM AND METHOD FOR RESISTIVITY INTERPRETATION

(71) Applicant: EarthSystems Technologies, Inc., Carrollton, TX (US)

(72) Inventor: John Bryant, Dallas, TX (US)

(73) Assignee: EARTHSYSTEMS TECHNOLOGIES OPERATING LLC, Carrollton, TX (US)

( * ) Notice: Subject to any disclaimer, the term of this patent is extended or adjusted under 35 U.S.C. 154(b) by 1260 days.

(21) Appl. No.: 17/450,915

(22) Filed: Oct. 14, 2021

(65) Prior Publication Data
US 2023/0119421 A1 Apr. 20, 2023

(51) Int. Cl.
*G06F 30/30* (2020.01)
*G06N 3/04* (2023.01)
*G06N 3/08* (2023.01)
*G06N 7/01* (2023.01)

(52) U.S. Cl.
CPC ............... *G06F 30/30* (2020.01); *G06N 3/04* (2013.01); *G06N 3/08* (2013.01); *G06N 7/01* (2023.01)

(58) Field of Classification Search
None
See application file for complete search history.

(56) References Cited

U.S. PATENT DOCUMENTS

| | | | |
|---|---|---|---|
| 7,386,402 B2 | 6/2008 | Bryant | |
| 7,788,049 B2 | 8/2010 | Bryant | |
| 7,813,883 B2 | 10/2010 | Bryant | |
| 8,019,547 B2 | 9/2011 | Bryant | |
| 8,321,160 B2 | 11/2012 | Bryant | |
| 11,323,285 B1 | 5/2022 | Bryant et al. | |
| 11,329,843 B1 | 5/2022 | Bryant et al. | |
| 11,513,244 B1 | 11/2022 | Bryant et al. | |
| 2011/0098929 A1* | 4/2011 | Tabanou | G01V 3/083 702/7 |
| 2019/0064378 A1* | 2/2019 | Liu | G01V 1/28 |
| 2021/0381365 A1* | 12/2021 | Clegg | G01V 3/26 |

* cited by examiner

Primary Examiner — Walter L Lindsay, Jr.
Assistant Examiner — Geoffrey T Evans
(74) Attorney, Agent, or Firm — Schultz & Associates, P.C.

(57) ABSTRACT

A system for interpreting electrical resistivity tomography (ERT) survey data and method of use is provided. The system analyzes resistivity data and associated test parameter matrices and interpretation matrices as input to a convolutional and an artificial neural network in order to determine whether or not a set of subsurface characteristics are present.

18 Claims, 21 Drawing Sheets

ELECTRICAL RESISTIVITY (ohm-m)

PROFILE R34. NORTHWEST TO SOUTHEAST DIRECTION

PROFILE R35. NORTHWEST TO SOUTHEAST DIRECTION

DEPTH (m)

760

762 — SCAN IMAGES FOR FEATURES AND CREATE FEATURE MAPS

764 — POOL DATA

766 — FLATTEN DATA

800

802 — STANDARDIZE IMAGES (OPTIONAL)

804 — INPUT IMAGES INTO DATASET

806 — FEATURE EXTRACTION

808 — ASSOCIATE TEST PARAMETERS MATRIX AND INTERPRETATION MATRIX WITH IMAGE FILES

812 — NORMALIZE THE TEST PARAMETERS MATRICES AND INTERPRETATION MATRICES

814 — COMBINE FLATTENED DATA WITH TEST PARAMETERS

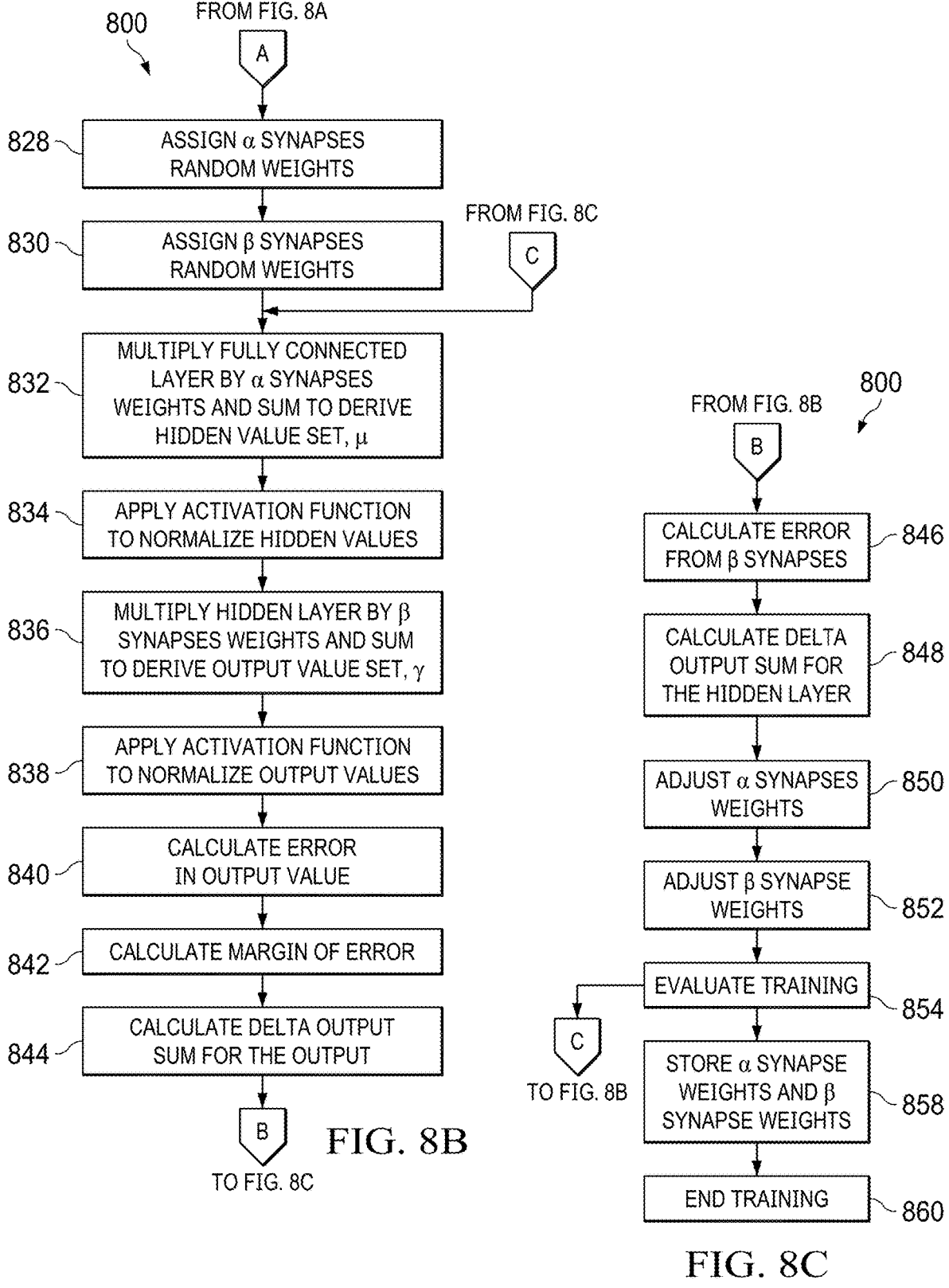

800

FROM FIG. 8A

A

828 — ASSIGN α SYNAPSES RANDOM WEIGHTS

830 — ASSIGN β SYNAPSES RANDOM WEIGHTS

FROM FIG. 8C

C

832 — MULTIPLY FULLY CONNECTED LAYER BY α SYNAPSES WEIGHTS AND SUM TO DERIVE HIDDEN VALUE SET, μ

834 — APPLY ACTIVATION FUNCTION TO NORMALIZE HIDDEN VALUES

836 — MULTIPLY HIDDEN LAYER BY β SYNAPSES WEIGHTS AND SUM TO DERIVE OUTPUT VALUE SET, γ

838 — APPLY ACTIVATION FUNCTION TO NORMALIZE OUTPUT VALUES

840 — CALCULATE ERROR IN OUTPUT VALUE

842 — CALCULATE MARGIN OF ERROR

844 — CALCULATE DELTA OUTPUT SUM FOR THE OUTPUT

FROM FIG. 8B

B

CALCULATE ERROR FROM β SYNAPSES — 846

CALCULATE DELTA OUTPUT SUM FOR THE HIDDEN LAYER — 848

ADJUST α SYNAPSES WEIGHTS — 850

ADJUST β SYNAPSE WEIGHTS — 852

EVALUATE TRAINING — 854

STORE α SYNAPSE WEIGHTS AND β SYNAPSE WEIGHTS — 858

END TRAINING — 860

FIG. 8C

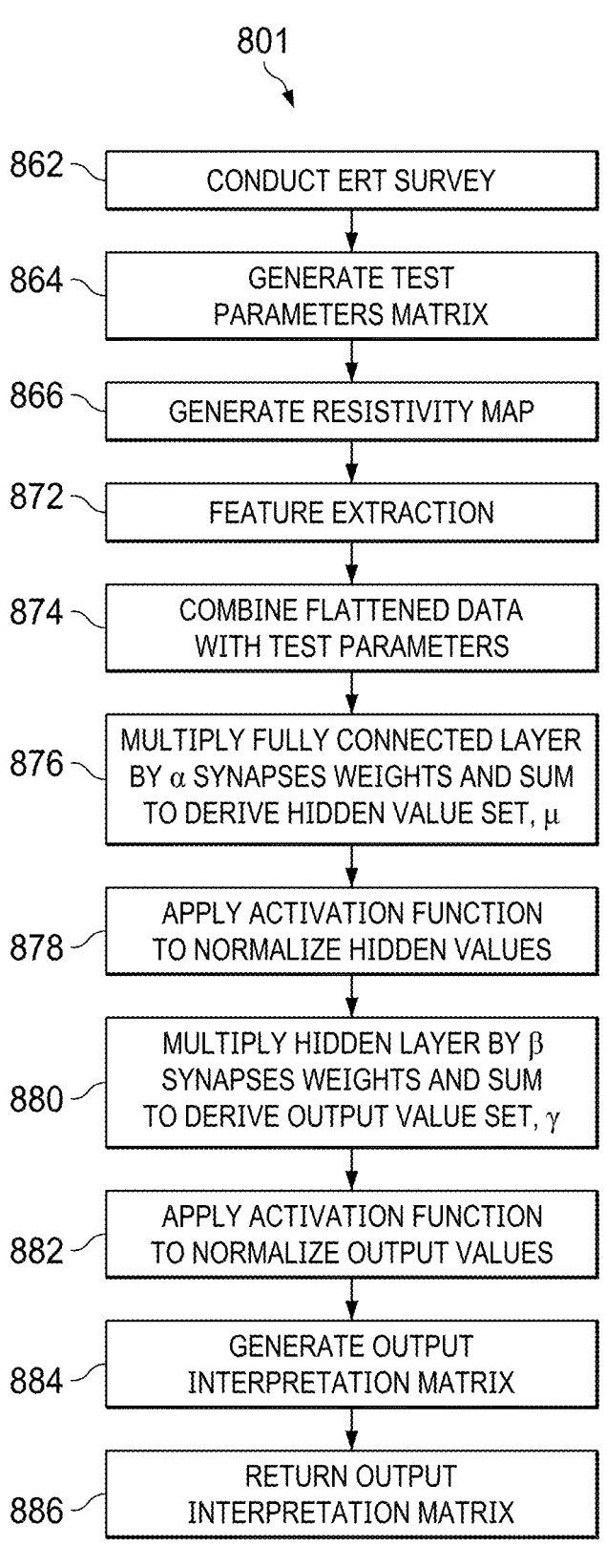

801

862 — CONDUCT ERT SURVEY

864 — GENERATE TEST PARAMETERS MATRIX

866 — GENERATE RESISTIVITY MAP

872 — FEATURE EXTRACTION

874 — COMBINE FLATTENED DATA WITH TEST PARAMETERS

876 — MULTIPLY FULLY CONNECTED LAYER BY α SYNAPSES WEIGHTS AND SUM TO DERIVE HIDDEN VALUE SET, μ

878 — APPLY ACTIVATION FUNCTION TO NORMALIZE HIDDEN VALUES

880 — MULTIPLY HIDDEN LAYER BY β SYNAPSES WEIGHTS AND SUM TO DERIVE OUTPUT VALUE SET, γ

882 — APPLY ACTIVATION FUNCTION TO NORMALIZE OUTPUT VALUES

884 — GENERATE OUTPUT INTERPRETATION MATRIX

886 — RETURN OUTPUT INTERPRETATION MATRIX

FIG. 8D

```
1    #import methods needed for image recognition
2    import tensorflow as tf
3    from keras.datasets import mnist #a preconfigured data set used to train the CNN
4    from PIL import Image_dataset #method used to import user dataset into CNN
5    from keras.models import Sequential # model used for CNN layers
6    from keras.layers import Dense #method for activation function layer
7    from keras.layers import Conv2D # method for convolution layer to search for filters/features
8    from keras.layers import Flatten # method for flattening image data for forward propagation
9    from keras.layers import MaxPooling2D # layer to reduce the spatial dimensions of output
10   from keras.layers import Dropout # method for reducing overfitting
11   import numpy as np #advanced mathematical functions needed for neural network
12
13   #Setup random seed to control start point
14   Seed=0
15   np.random.seed(seed) #fix random seed
16   Tf.random.set_seed(seed)
17
18   #input image dimensions
19   num_Interpretations = 10 # 10 possible subsurface characteristics
20   img_rows, img_cols = 28, 28 #image dimensions in pixels
21
22   # X = Resistivity Maps; Y = Test Parameters; Z = Interpretation Column
23   #The data sets are split into train and test sets
24   (x_train, y_train, z_train), (x_test, y_test, z_test) = mnist.load_data(), PIL.load_data()
25   x_train = x_train.reshape(x_train.shape[0], img_rows, img_cols, 1)
26   x_test = x_test.reshape(x_test.shape[0], img_rows, img_cols,1)
27
28   input_shape = (img_rows, img_cols, 1)
29
30   #convert the image set to float
31   x_train = x_train.astype('float32')
32   x_test = x_test.astype('float32')
33
34   #rescale or "normalize" image dataset to interval [0,1]
35   x_train/ = 255
36   x_test/ =255
37
38   #returns binary matrix of Test Parameters (normalizes data)
39   y_train = keras.utils.to_categorical(y_train, num_TestParameters)
40   y_test = keras.utils.to_categorical(y_test, num_TestParameters)
41   #returns binary matrix of Interpretation classes
42   z_train = keras.utils.to_categorical(z_train, num_Interpretations)
43   z_test = keras.utils.to_categorical(z_test, num_Interpretations)
```

FIG. 9A

```
44    #build neural network
45    model = Sequential()
46    #1st Conv. layer with 32 filters (i.e. RGB, Black/W, Edges, curves, etc.)
47    # a 3x3 window size, sigmoid activation, and stride =1
48    model.add(Conv2D(32, kernel_size = (3,3), activation='sigmoid', strides = (1,1))
49
50    model.add(MaxPooling2D (pool_size = (2, 2))) # add first pooling layer
51
52    #add second convolutional layer with 64 filters (filters can become more specific)
53    model.add(Conv2D(64, (3, 3), activation='sigmoid'))
54
55    model.add(MaxPooling2D(pool_size=(2,2))) #add second pooling layer
56
57    model.add(Flatten()) #flatten data
58
59    #add a dense sigmoid layer
60    model.add(Dense(1024, activation = 'sigmoid'))
61
62    #apply dropout with rate of 0.5 to reduce overfitting
63    model.add(Dropout(0.5))
64
65    #add soft-max layer converts output into probability of an Interpretation class
66    model.add(Dense(num_Interpretation, activation='softmax'))
67
68    #compile model using accuracy to measure model performance
69    model.compile(optimizer='adam', loss='categorical_crossentropy', metrics =['accuracy'])
70
71    #train CNN for 150,000 times
72    model.fit((x_train+ y_train), z_train, validation_data=(x_test, y_test, z_test), epochs =
73    150,000
74    #evaluate the model
75    Score = model.evaluate(x_test, y_test, z_test verbose=1)
76
77    #print performance
78    print()
79    print('Test loss:', score[0])
80    print('Test accuracy:', score[1])
81
82    #run CNN to predict Interpretations for the test set of Resistivity Maps/Test Parameters
83    print(model.predict_Interpretations(x_test[], y_test[]))
84
85    #retrieve actual results for test data set
86    print(z_test[])
```

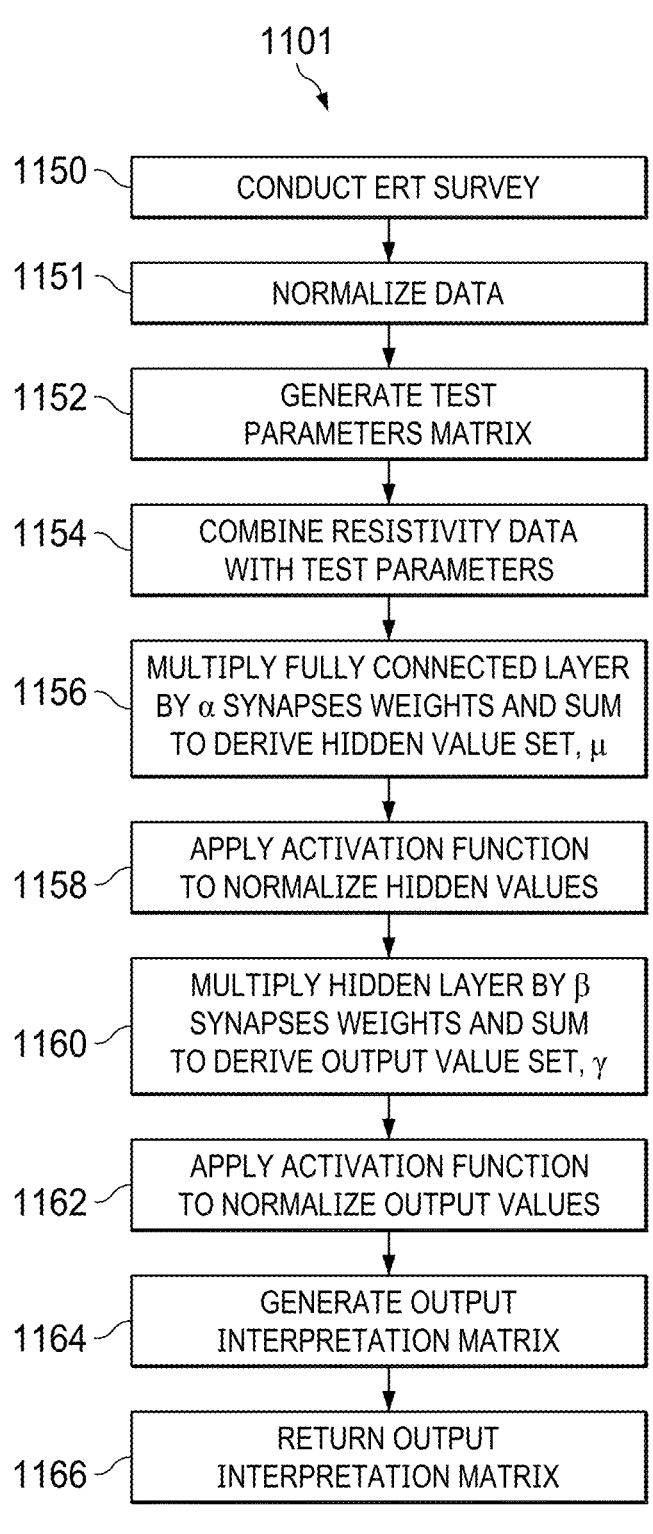

1150 — CONDUCT ERT SURVEY

1151 — NORMALIZE DATA

1152 — GENERATE TEST PARAMETERS MATRIX

1154 — COMBINE RESISTIVITY DATA WITH TEST PARAMETERS

1156 — MULTIPLY FULLY CONNECTED LAYER BY α SYNAPSES WEIGHTS AND SUM TO DERIVE HIDDEN VALUE SET, μ

1158 — APPLY ACTIVATION FUNCTION TO NORMALIZE HIDDEN VALUES

1160 — MULTIPLY HIDDEN LAYER BY β SYNAPSES WEIGHTS AND SUM TO DERIVE OUTPUT VALUE SET, γ

1162 — APPLY ACTIVATION FUNCTION TO NORMALIZE OUTPUT VALUES

1164 — GENERATE OUTPUT INTERPRETATION MATRIX

1166 — RETURN OUTPUT INTERPRETATION MATRIX

FIG. 11C

```
1    import numpy as np #advanced mathematical functions needed for neural network
2
3    # X = resistivity matrix and test parameters ; Y = Interpretation matrix
4    # y characteristic (e.g. sand, clay, rock, cavity, water, oil, gas, metal, tunnel, leak...)
5    xAll= np.array(([21, 6, 7.5, 30, 150, ...], [76, 500, 350, 36,220 ...], [21, 36, 50, 70, 10, ...],
6    [76, 360, 500, 59, 30, ...]), dtype=float) # input data
7    y = np.array(([10, 45, 75, 22, 85, 0...], [13, 23, 90, 62, 33, 24, ...], [86, 35, 68, 29, 52,
8    12...]), dtype=float) # Interpretation Matrix output
9    # scale units
10   xAll = xAll/np.amax(xAll, axis=0) # scaling input data
11   y = y/100 # scaling output data (max probability is 100)
12
13   # split data
14   X = np.split(xAll, [3])[0] # training data
15   xPredicted = np.split(xAll, [3])[1] # testing data
16
17   # Create neural network
18   class Neural_Network(object):
19     def __init__(self):
20     #parameters for size of neural network, more hidden layers for deeper learning
21       self.inputSize = 10 # exemplary number of input resistance readings
22       self.outputSize = 8 # output a probability for each subsurface characteristic
23       self.hiddenSize = 11 # 11 weighted nodes
24
25     #weights
26       self.W1 = np.random.randn(self.inputSize, self.hiddenSize) # (11x10) weight to hidden
27       self.W2 = np.random.randn(self.hiddenSize, self.outputSize) # (11x8) weight to output
28
29     #forward propagation through our network
30     def forward(self, X):
31       self.z = np.dot(X, self.W1) # calculate dot product of input and first set of weights
32       self.z2 = self.sigmoid(self.z) # apply activation function
33       self.z3 = np.dot(self.z2, self.W2) # calculate dot product of hidden second set of weights
34       o = self.sigmoid(self.z3) # apply final activation function
35       return o # return prediction
36     # activation function
37     def sigmoid(self, s):
38       return 1/(1+np.exp(-s))
39
40     #derivative of sigmoid
41     def sigmoidPrime(self, s):
42       return s * (1 -s)
43
```

FIG. 12A

```
44    # backward propagate through the network to train
45    def backward(self, X, y, o):
46        self.o_error = y -o # determine error in output
47        self.o_delta = self.o_error*self.sigmoidPrime(o) # apply sigmoid derivative to error
48    # determine hidden error: how much our hidden layer weights contributed to output error
49    self.z2_error = self.o_delta.dot(self.W2.T)
50    # apply sigmoid derivative to hidden error
51        self.z2_delta = self.z2_error*self.sigmoidPrime(self.z2)
52        self.W1 += X.T.dot(self.z2_delta) #  adjust first set weights (input to hidden)
53        self.W2 += self.z2.T.dot(self.o_delta) # adjust second set weights (hidden to output)
54
55    #create output in forward propagation and use backward propagation to train system
56        def train(self, X, y):
57            o = self.forward(X)
58            self.backward(X, y, o)
59
60    # save weights
61    def saveWeights(self):
62        np.savetxt("w1.txt", self.W1, fmt="%s")
63        np.savetxt("w2.txt", self.W2, fmt="%s")
64
65    #prints predicted output after training
66        def predict(self):
67        print ("Predicted data based on trained weights: ");
68        print ("Input (scaled): \n" + str(xPredicted));
69        print ("Output: \n" + str(self.forward(xPredicted)));
70
71    #run neural network
72    NN = Neural_Network()
73    Loss = str(np.mean(np.square(NN.forward(X) -y))) #mean sum squared loss
74    IdealLoss = str(.00001)
75    for i in range(150000):# trains the NN 150,000 times or until loss reaches an ideal loss value
76        if Loss > IdealLoss:
77        print ("# " + str(i) + "\n")
78        print ("Input (scaled): \n" + str(X))
79        print ("Actual Output: \n" + str(y))
80        print ("Predicted Output: \n" + str(NN.forward(X)))
81        print ("Loss: \n" + Loss)
82        print ("\n")
83        NN.train(X, y);
84        else: break #if ideal loss is achieved training ends to reduce computational expense
85
86    NN.saveWeights() #saves optimum weights after training
87    NN.predict() #runs a prediction after training
```

FIG. 12B

SYSTEM AND METHOD FOR RESISTIVITY INTERPRETATION

FIELD OF THE INVENTION

The present invention relates to the characterization of electrical resistivity surveys using artificial intelligence.

BACKGROUND OF THE INVENTION

Geophysical surveys are often conducted to determine subsurface properties for various reasons, such as leak detection, analysis of anomalies and forensic structural failure analysis.

Electrical resistivity tomography (ERT) is a well-known geophysical technique for imaging subsurface structures using electrical resistivity measurements made from a current impressed onto electrodes fixed in the ground.

Resistivity can be computed if the intensity of a current injected into the ground, and the resulting potential differ-ence established between measurement electrodes are known. Resistivity depends on the nature of the soil, the injected current, the method used to measure the injected current, the resulting potential difference between the elec-trodes and on the geometry of the electric field created between the electrodes.

In practice, an array of electrodes is positioned in the ground in a known geometric pattern. The positions of the injector and measurement electrodes is known as "topol-ogy". Many topologies are known for electrode placement in an ERT survey. Examples are the Wenner, Wenner-Schlum-berger, pole-dipole and dipole-dipole topologies.

In each topology, a known current is introduced through a pair of injection electrodes. An electric field results. The resulting electric field is measured as a voltage at measure-ment electrodes in the array. Resistivity valves at various depths in the ground can then be determined from the known current and the measured voltages.

Referring to FIG. 1, an example dipole-dipole topology 100 is shown. In the dipole-dipole topology, the spacing between the current injection probes 105 and the voltage measurement probes 107 is the same. The spacing is typi-cally a whole number multiplier "n" of the distance "a".

Referring to FIG. 2, an example of a channel of test data in an ERT survey using a dipole-dipole topology 200 will be described. Electrodes 202, 204, 206, 208, 210, 212, 214, 216, 218, 220 and 222 are inserted in ground 224 at an equidistant spacing "a" in a straight line. A known current is injected at current injection probes 230. The resulting dif-ferential voltage at electrode pairs 237, 239, 241, 243, 245, 247, 249 and 251, is measured. The apparent resistivity of the subsurface can be determined from these measurements at different depths, and forms a two-dimensional matrix of resistivity values. In this example, impressing a current through injection probes 230 and taking a voltage reading at electrode pairs 237 results in a resistivity value for position 280 at depth 260 and horizontal distance 268. Similarly, a voltage reading at electrode pairs 239 results in a resistivity value for position 281 at depth 261 and horizontal distance 269. Likewise, a voltage reading at electrode pairs 241 results in a resistivity value for position 282 at depth 262 and horizontal distance 270. A voltage reading at electrode pairs 243 results in a resistivity value for position 283 at depth 263 and horizontal distance 271. A voltage reading at electrode pairs 245 results in a resistivity value for position 284 at depth 264 and horizontal distance 272. A voltage reading at electrode pairs 247 results in a resistivity value for position

285 at depth 265 and distance 273. A voltage reading at electrode pairs 249 results in a resistivity value for position 286 at depth 266 and distance 274. A voltage reading at electrode pairs 251 results in a resistivity value for position 287 at depth 267 and distance 275. As can be seen, the farther away the voltage electrodes are from the current injection electrodes, the deeper into the earth the resistivity values are taken. The string of resistivity values for this single placement of the current injection probes can be termed a "channel" of resistivity data.

Referring to FIG. 3, in order to complete an ERT survey, several (or many) channels of data are required. After each set of voltage measurements is taken, the current injection probes are typically advanced in one direction along the array. For example, from position 302 to positions 304, 306, 308, 310, 312 and 314, in sequence. As different voltage differential measurements are taken, separate channels of resistivity readings are derived and advanced in the same sequence from channel 320, channel 322, to channel 324, to channel 328, to channel 330 and to channel 332. The channels form linear diagonal lines at approximately 45° from an interstitial position between the current injection nodes. The result is a set of differential resistivity values associated with a set of subsurface points directly below the electrodes. The set of differential resistivity values is then subjected to curve smoothing routines which result in a set of continuous equipotential lines on a resistivity "map" that can be interpreted to locate subsurface anomalies.

Many systems currently exist for carrying out an ERT survey. One such system is described in U.S. Pat. No. 8,019,547 to Bryant. The invention described in the '547 Patent employs reconfigurable nodes located at each elec-trode in the array operated by a master controller. One novel feature of the invention of the '547 Patent is that the nodes may be set as either current impression nodes or voltage measurement nodes. U.S. Pat. No. 8,019,547 is incorporated herein by reference.

U.S. Pat. Nos. 8,321,160; 7,788,049; 7,813,883 and 7,386,402 to Bryant similarly disclose the use of a recon-figurable array of electrodes inserted into the ground. U.S. Pat. Nos. 8,321,160; 7,788,049; 7,813,883 and 7,386,402 are incorporated herein by reference.

U.S. patent application Ser. Nos. 17/302,050; 16/948,059; 16/948,061 and 16/948,062 to Bryant disclose the use of nodes comprised of a hermetically sealed controller housing with controller boards interchangeably connected to elec-trodes inserted into the ground. U.S. application Ser. Nos. 17/302,050; 16/948,059; 16/948,061 and 16/948,062 are incorporated herein by reference.

U.S. patent application Ser. No. 17/249,974 to Bryant discloses the use of nodes comprised of a hermetically sealed controller housing with a uniformly radiating elec-trode geometry, such as a hemispherical geometry. U.S. application Ser. No. 17/249,974 is incorporated herein by reference.

When an ERT survey is conducted using such systems, a matrix of resistivity values is created and generally stored as a table. A resistivity "model" is then derived using math-ematical techniques to minimize error in the data. The resistivity model is then subjected to geostatistical analysis, using kriging or other methods to derive a resistivity map. In general, the resistivity map is a graphical display of the resistivity values modified so that it may be interpreted by a human user to locate and identify subsurface anomalies.

Referring then to FIGS. 4A and 4B, ERT test survey maps 400 and 401 are representative of a typical resistivity map produced from an ERT survey. In these cases, the topology of each ERT system includes twenty nodes in a dipole-dipole topology and the test were taken at parallel locations. The nodes used to produce map 400 were located at positions 402, 404, 406, 408, 410, 412, 414, 416, 418, 420, 422, 424, 426, 428, 430, and 432. The nodes used to produce map 401 were located at positions 434, 436, 438, 440, 442, 444, 446, 448, 450, 452, 454, 456, 458, 460, 462, and 464. Each of the nodes is placed at internode spacing about 2 meters.

Notably the maps include equipotential shades indicating varying bands of resistivity at varying depths in the soil. The bands are then interpreted to identify subsurface properties and anomalies, such as moisture, voids, density changes etc. High resistivity typically is interpreted as stone or a void. Low resistivity is typically interpreted as water, or wet soil.

Currently, resistivity data is manually interpreted based on a resistivity map, such as maps 400 and 401, and the known testing parameters, such array shape, current injected, surface soil properties, typical moisture content, and location. However, the mathematical techniques required to generate the resistivity map are computationally expensive. The high computational expense slows processing time and requires a reasonably high level of bandwidth to compute. Further, even though the resistivity maps may be accurate, it requires many years of geophysical training and experience by a human user to interpret them and even then, they may be misinterpreted. Moreover, interpretation of resistivity data often takes a tremendous amount of human time, which increases exponentially with the size of the ERT survey.

Thus, there is a need in the art for a means of increasing the accuracy and speed with which resistivity data may be interpreted.

BRIEF DESCRIPTION OF THE DRAWINGS

In the detailed description of the preferred embodiments presented below, reference is made to the accompanying drawings.

FIGS. 8A, 8B, and 8C is a flow chart of a method for training a convolutional neural network to recognize subsurface characteristics in a resistivity map.

FIG. 8D is a flow chart of a method for using a trained convolutional neural network to recognize subsurface characteristics.

FIGS. 9A and 9B is a preferred software code implementation of a preferred embodiment of a convolutional neural network.

FIG. 11C is a flow chart of a method for using a trained artificial neural network to recognize subsurface characteristics in a resistivity model.

FIGS. 12A and 12B is a preferred software code implementation of a preferred embodiment of an artificial neural network.

DETAILED DESCRIPTION OF THE INVENTION

In the description that follows, like parts are marked throughout the specification and figures with the same numerals, respectively. The figures are not necessarily drawn to scale and may be shown in exaggerated or generalized form in the interest of clarity and conciseness. Unless otherwise specified, all tolerances are plus or minus 20%.

Figure 1:
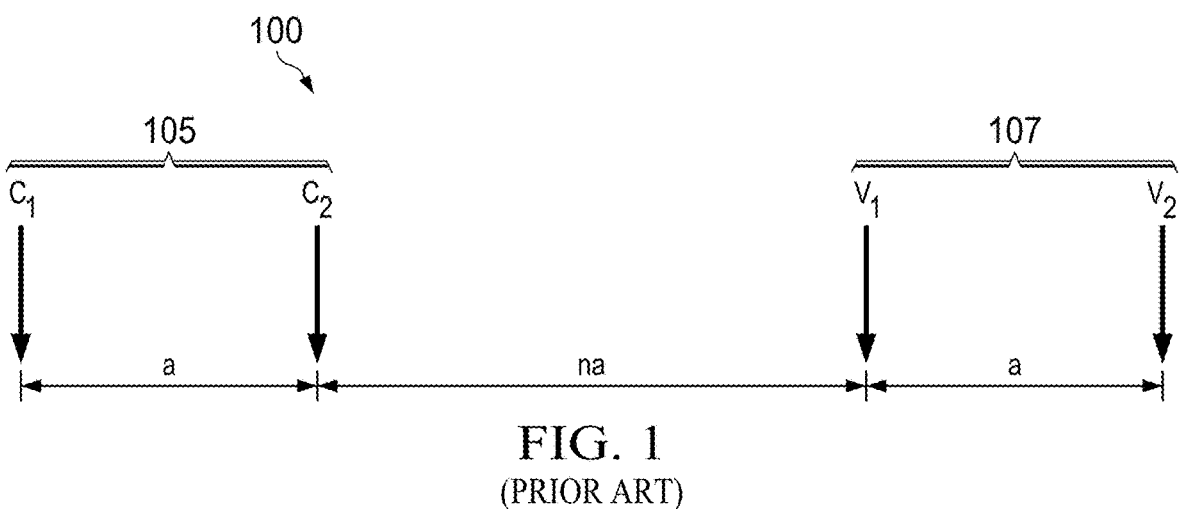
FIG. 1 is a schematic diagram of a prior art dipole-dipole arrangement topology.
Figure 3:
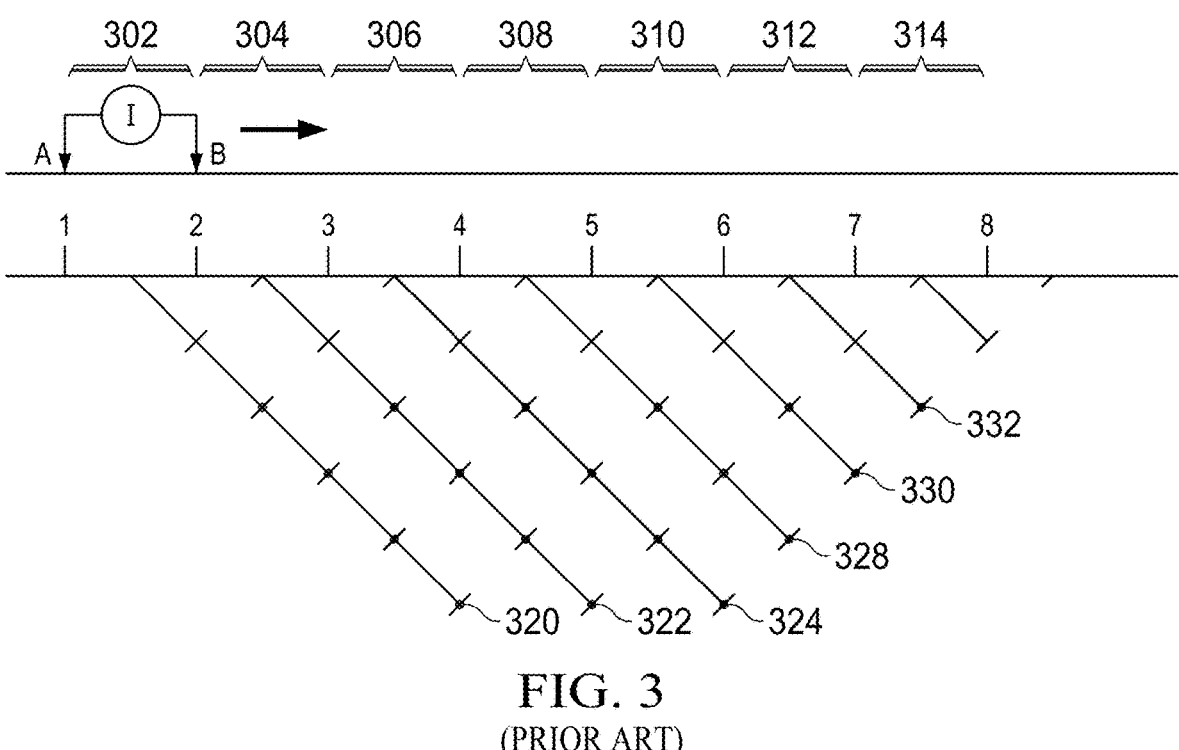
FIG. 3 is a schematic diagram of a prior art set current injection probes configured in a a-dipole-dipole topology.
Figure 2:
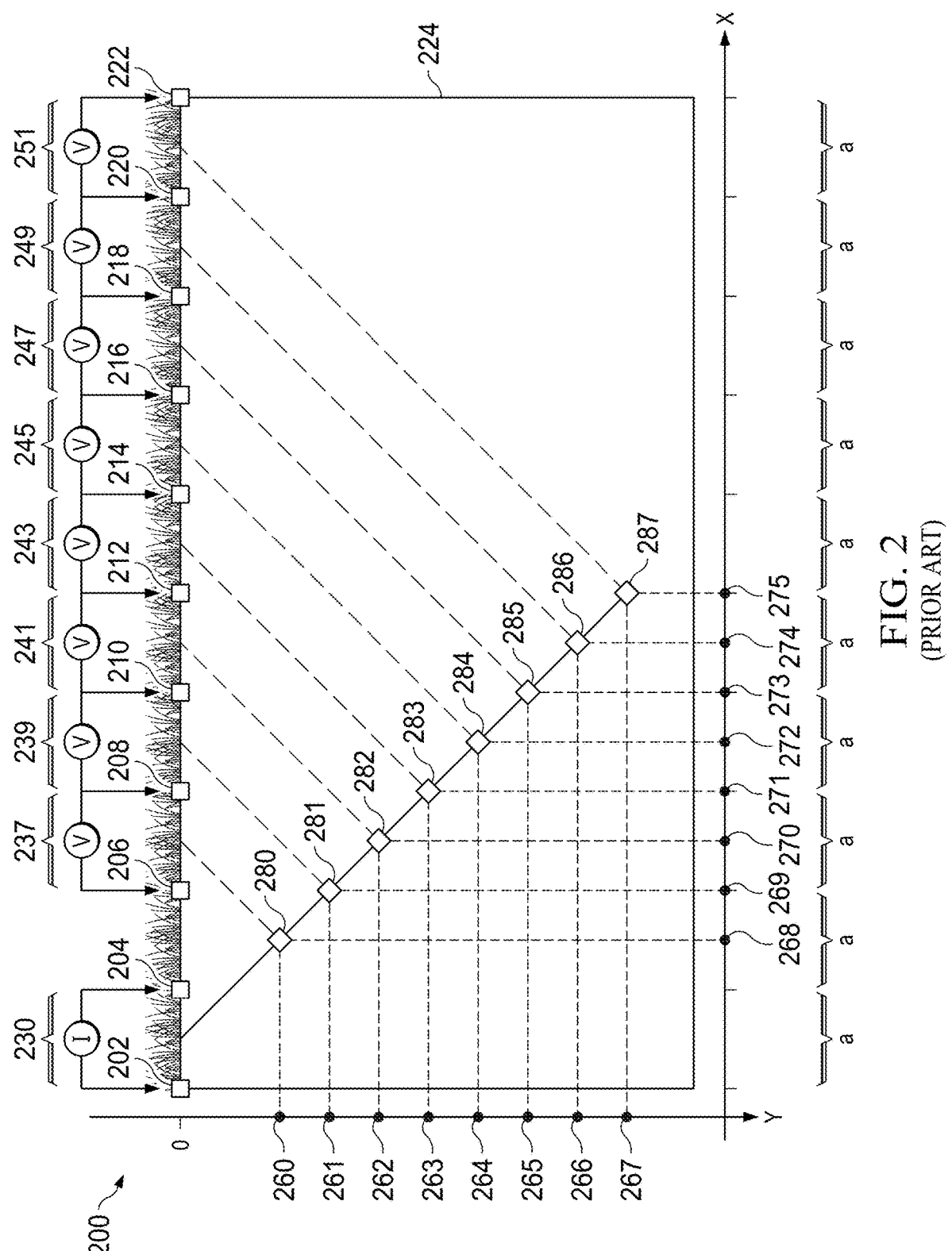
FIG. 2 is a schematic diagram of a prior art dipole-dipole test data channel.
Figures 4A, 4B:
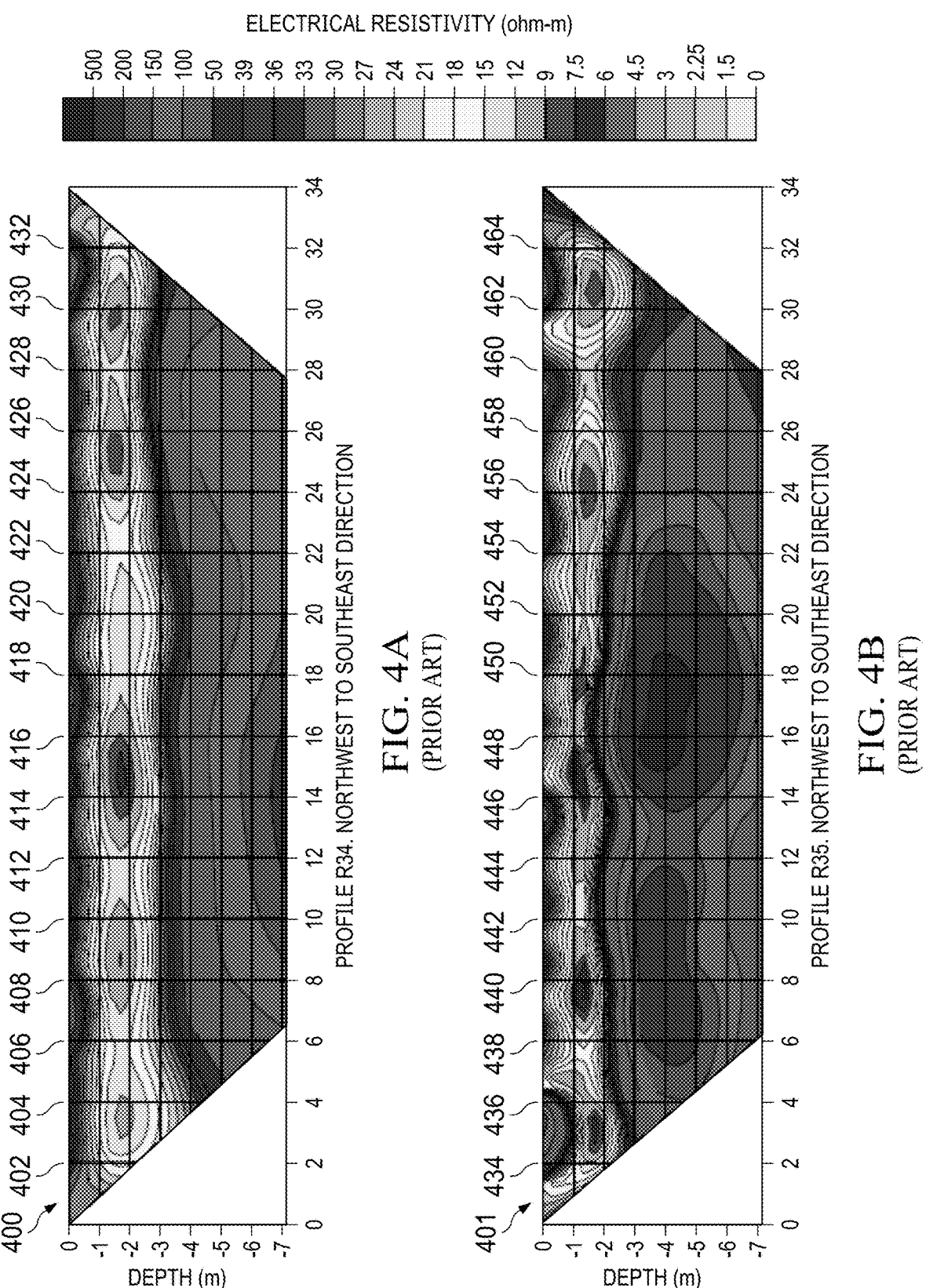
FIG. 4A is an exemplary resistivity map created from an ERT survey.
FIG. 4B is an exemplary resistivity map created from an ERT survey.
Figure 5:
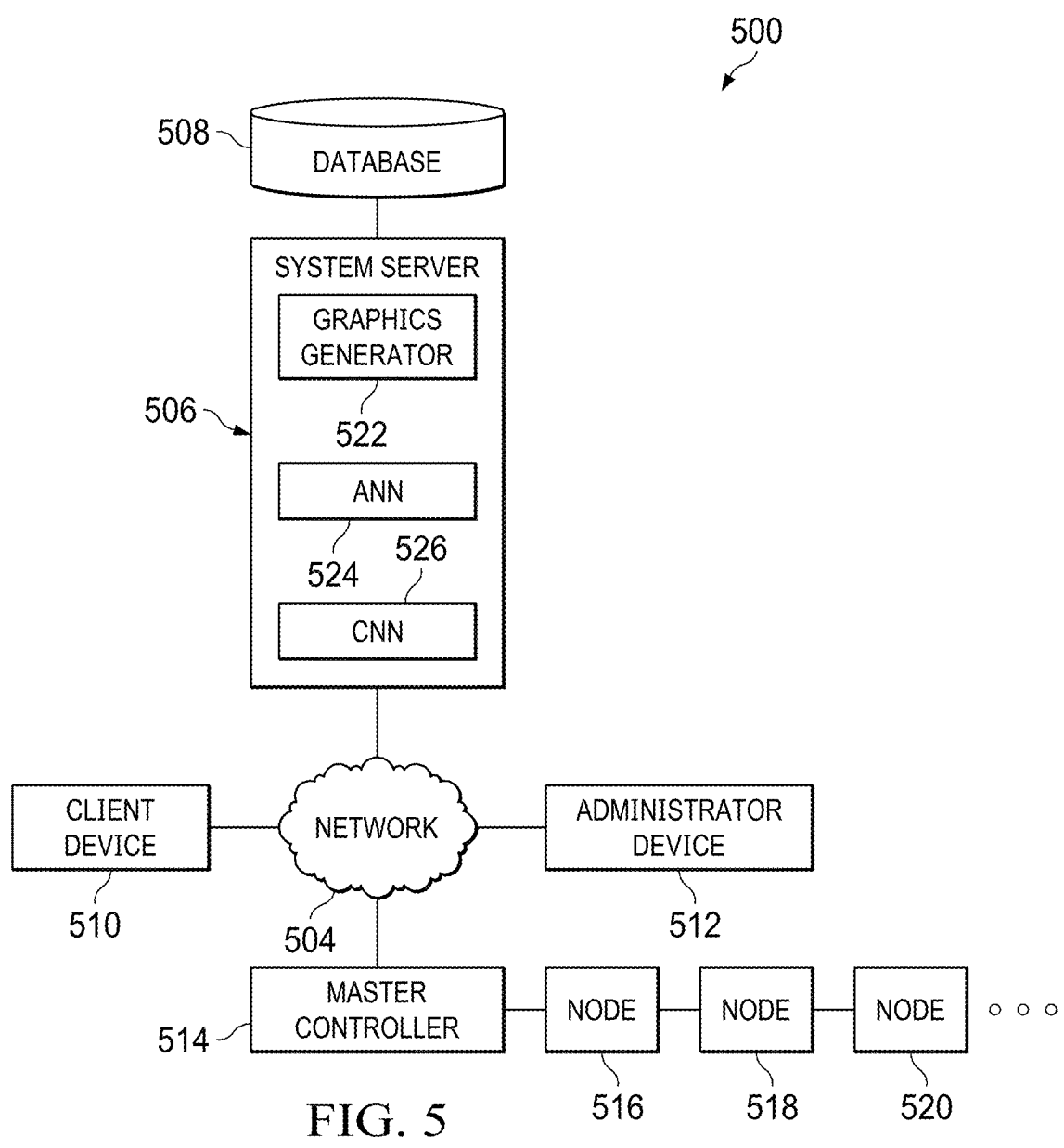
FIG. 5 is a network diagram of a preferred embodiment of a resistivity data interpretation system.

Referring then to FIG. 5, a preferred embodiment of resistivity interpretation system 500 is shown. System 500 is comprised of administrator device 512, system server 506, and client device 510. System server 506 is operatively connected to database 508. Administrator device 512 and client device 510 are each a smart device, such as a personal computer, tablet, or smart phone.

Administrator device 512, system server 506, and client device 510 are connected through network 504. Network 504 is a wide area network, such as the internet. Administrator device 512, system server 506, and client device 510 are connected to master controller 514 through network 504. Master controller 514 is further connected to a plurality of nodes, such as node 516, node 518, and node 520. Together, the master controller and the nodes form an ERT survey system, such as those set out in U.S. Pat. Nos. 8,321,160, 7,788,049, 7,813,883, 7,386,402, and 8,019,547 to Bryant. The number of nodes used may vary depending on the size of the geographic region being surveyed and the node topology, as known in the art.

Resident on system server 506 is graphics generator 522, artificial neural network 524, and convolutional neural network 526. In general, graphics generator 522 consumes unprocessed resistivity data from an ERT survey and creates a resistivity map. Convolutional neural network 526 uses image recognition to generate an interpretation of the subsurface characteristics shown on a resistivity map. Artificial neural network 524 generates an interpretation of subsurface characteristics based on unprocessed resistivity data.

Figure 6A:
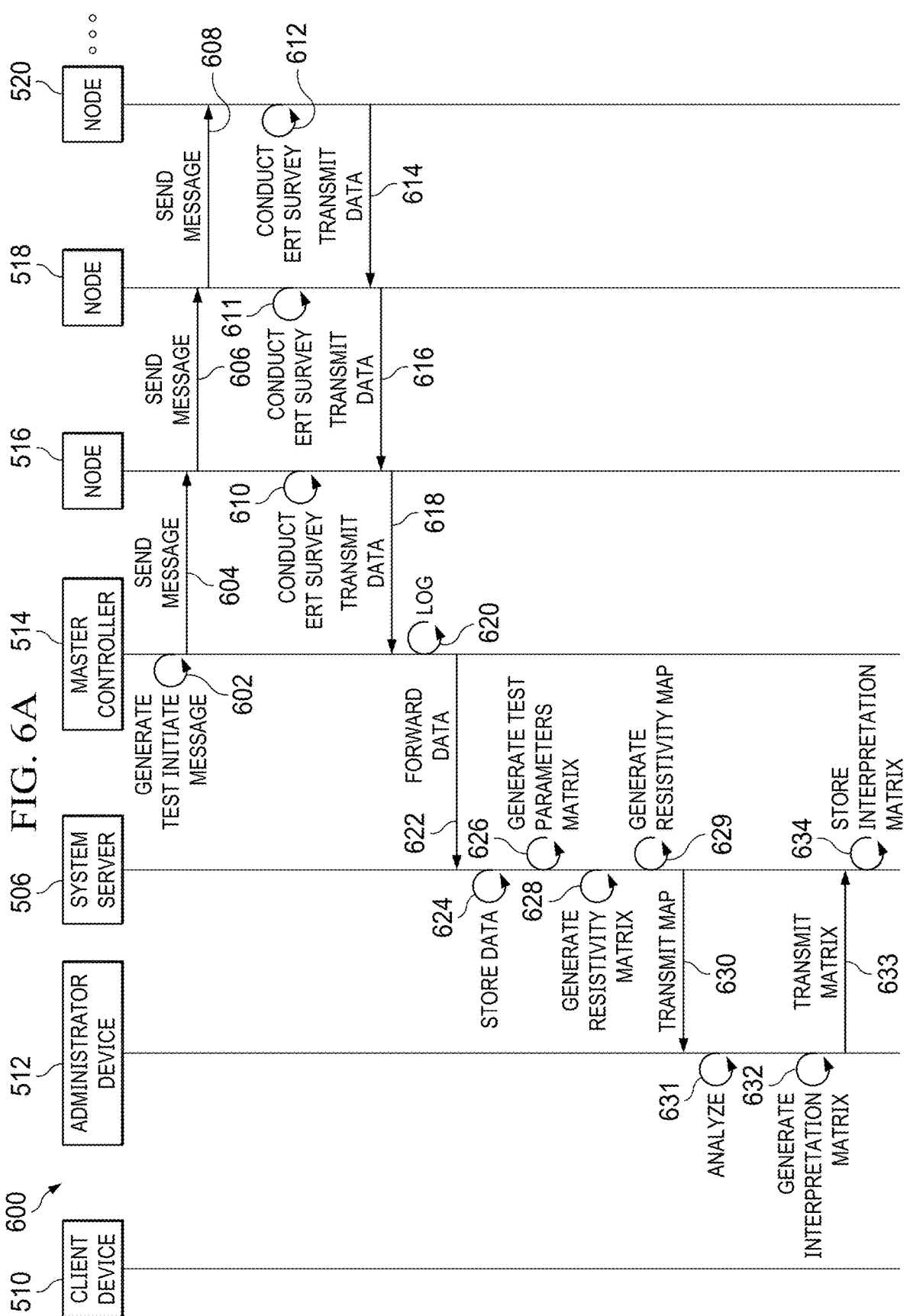
FIGS. 6A and 6B is a preferred method of resistivity data interpretation.
Figure 6B:
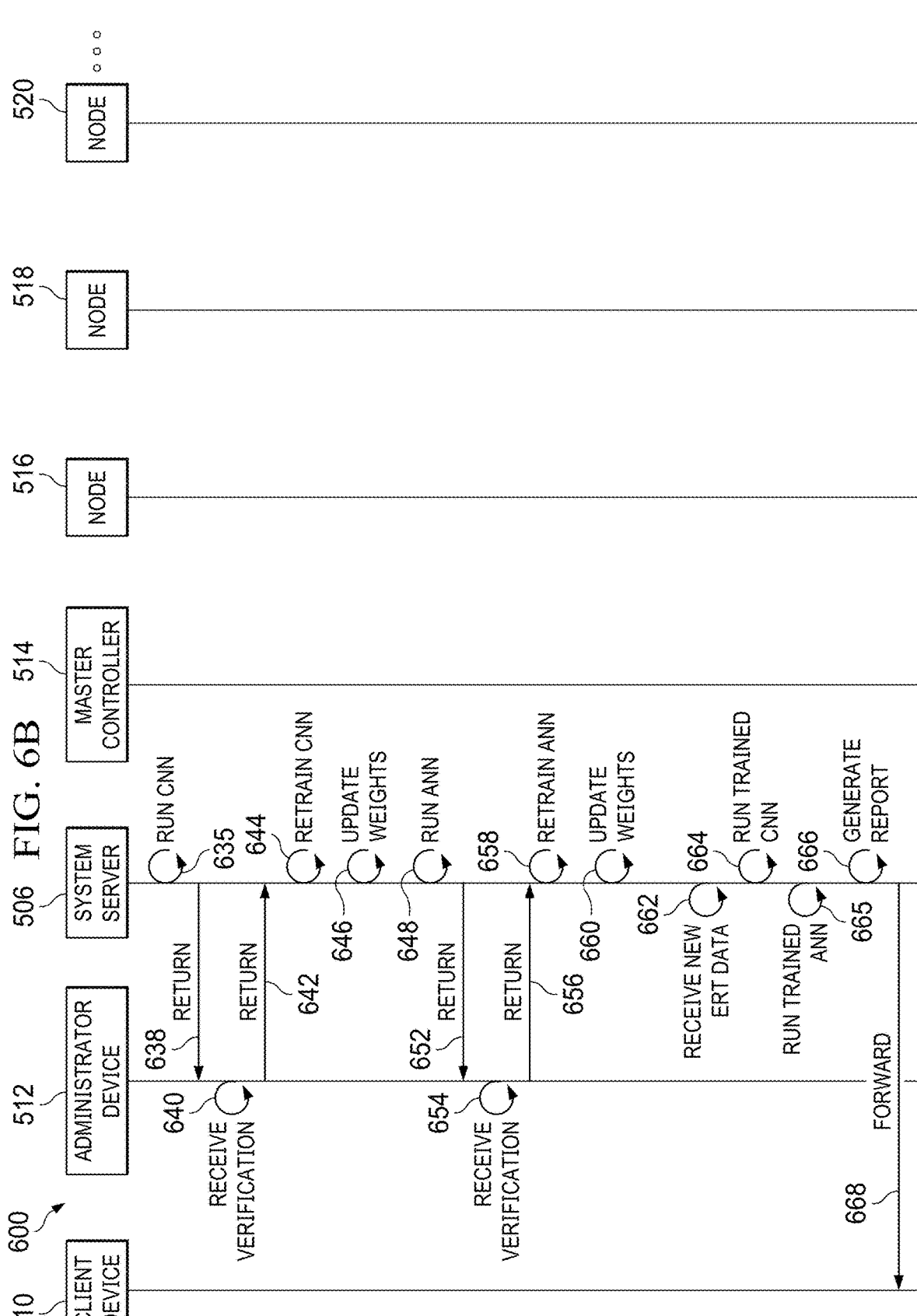

Referring then to FIGS. 6A and 6B, preferred method 600 for interpreting resistivity data will be described.

At step 602, an ERT survey test initiation message is generated at master controller 514. At step 604, the test initiation message is transmitted to node 516. At step 606, the test initiation message is transmitted to node 518. At step 608, the test initiation message is transmitted to node 520. A test initiation message is transmitted to all nodes in the array.

At steps 610, 611, and 612 an ERT survey is conducted at each of the nodes in the array. At steps 614, 616, and 618 the resistivity readings taken during the ERT survey are transmitted to master controller 514. At step 620, the master controller logs the test results.

At step 622, the ERT test results are forwarded to system server 506. At step 624, the system server stores the ERT test results in the database. At step 626, the system server generates a test parameters matrix. The test parameters matrix contains the known environmental factors and the test settings utilized. Environmental factors include characteristics of the survey location, such as the longitude and latitude of the survey location, soil types, weather history, surface conditions, humidity, the soil moisture content, typical regional climate, month of the year, time of day, current weather conditions, and population. Other environmental factors may be included in the matrix. Test settings include information such as the array topology, the minimum and maximum current and voltage levels, error rate, and data acquisition frequency. Other test settings may be included in the matrix.

In a preferred embodiment, test parameters are included to provide context to resistivity data. The additional context aides in manual evaluation of the data and likewise reduces the computational expense of evaluating the data. However, it should be appreciated that the test parameters are not required to evaluate the data.

At step 628, the system generates a resistivity matrix representing the resistivity readings for the test. At step 629, the graphics generator creates a resistivity map based on the resistivity readings. At step 630, the resistivity map is transmitted to administrator device 512. At step 631, the resistivity map is manually analyzed. At step 632, an interpretation matrix is generated. In a preferred embodiment, an interpretation matrix includes a list of potential subsurface characteristics that are identified during manual analysis of the resistivity maps. Subsurface characteristics include high density probability, low density probability, moisture probability, and geological anomaly probability. The subsurface characteristics may include more detailed probabilities such as the probability that the following characteristics are present: tunnels, water leaks, stone, clay, minerals, pipes, aquifers, etc., other subsurface characteristics may be included.

At step 633, the interpretation matrix is transmitted to system server 506. At step 634, the interpretation matrix is associated with the corresponding ERT resistivity test file and the ERT resistivity map, and stored in the database.

At step 635, the server runs convolutional neural network 526 to produce an output interpretation matrix, as will be further described. At step 638, the output interpretation matrix is returned to the administrator device.

At step 640, optionally, the administrator device receives a manual verification whether or not the prediction made by the output interpretation matrix is accurate. At step 642, the manual verification is returned to the system server. At step 644, the server retrains the convolutional neural network based on the verification. The system may initiate a retraining session on command or when a predetermined number of new verified resistivity maps are generated. At step 646, the system updates the convolutional neural network synapse weights, as will be further described.

At step 648, the server runs artificial neural network 524 to produce an output interpretation matrix, as will be further described. At step 652, the interpretation matrix is returned to the administrator device.

At step 654, the administrator device optionally receives a manual verification of the interpretation matrix. At step 656, the manual verification is returned to the server. At step 658, the server retrains the artificial neural network based on the verification. In a preferred embodiment, the interpretation matrix and its associated resistivity data set are used to automatically train the artificial neural network. At step 660, the system updates the artificial neural network weights, as will be further described.

At step 662, the system server receives a new ERT dataset including an ERT resistivity map and associated test parameters matrix. At step 664, the system server inputs the new ERT dataset into and runs trained convolutional neural network 526 to characterize the resistivity data, as will be further described. At step 665, the system runs trained artificial neural network 524 to characterize the resistivity data, as will be further described.

At step 666, the system server generates a report containing the output interpretation matrix. At step 668, the report is transmitted to client device 510.

Figure 7A:
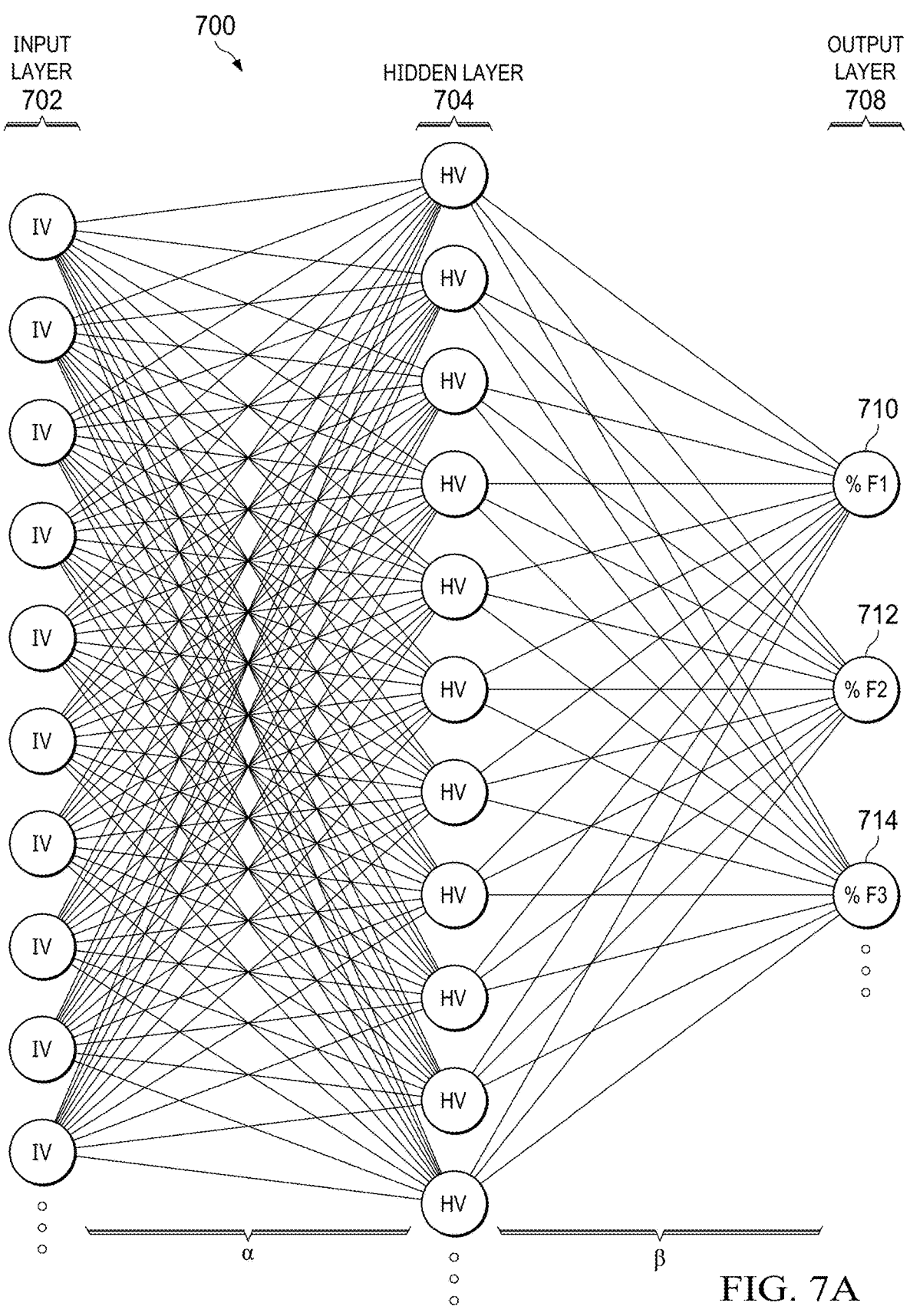
FIG. 7A is a preferred embodiment of a convolutional neural network for identifying subsurface characteristics in a resistivity map.

Referring then to FIG. 7A, a preferred embodiment of a convolutional neural network for interpreting subsurface characteristics in a resistivity map will be further described.

Neural network 700 includes input layer 702, hidden layer 704, and output layer 708. Other numbers of nodes and layers may be used.

Input layer 702 has one node for each input value (IV) considered in interpreting a resistivity map. For instance, the nodes may represent extracted values from a resistivity map, and test parameters, as will be further described. The input layer may have a greater or lesser number of nodes based on the number of input values. In this illustrative example, a 10×1 input matrix is shown, but more input values are typically used to accurately represent the resistivity map and test parameters, as will be further described. Training data also includes a known output interpretation matrix for each data set, as will be further described.

Each node of input layer 702 is connected to each node of hidden layer 704 via α synapses. During training, each α synapse is initially assigned a random weight between 0 and 1. The input layer nodes are multiplied by the α synapses, summed, and processed using an activation function to produce a hidden value, HV, for hidden layer nodes, as will be further described.

Hidden layer 704 is comprised of a plurality of weighted nodes. Hidden layer 704 preferably includes a bias node. The inclusion of a bias node reduces the variance and increases efficiency. In this example, convolutional neural network is shown with eleven (11) nodes in the hidden layer, however, one of skill in the art will recognize that other arrangements, numbers and layers of neurons are possible that may provide the desired predictive features of the invention.

Each node of hidden layer 704 is connected to output layer 708 by β synapses. During training, each β synapse is initially assigned a random weight between 0 and 1.

The nodes of hidden layer 704 are multiplied by β synapses, summed, and processed using an activation function to produce the output probability values for output layer 708, as will be further described.

Neural network 700 includes a plurality of output nodes in output layer 708. Each output node represents a probability that a specific subsurface characteristic, feature, or anomaly, is present in a resistivity map. In this example, output layer 708 is shown with output node 710, output node 712, and output node 714. The values F1, F2, and F3 for each of nodes 710, 712, and 714, respectively, might range from 0 to 1 with a value of 1 being 100% probability that the characteristic is in the survey site. However, it should be appreciated that any number of output nodes could be used to represent a plurality of possible subsurface characteristics.

Figure 7B:
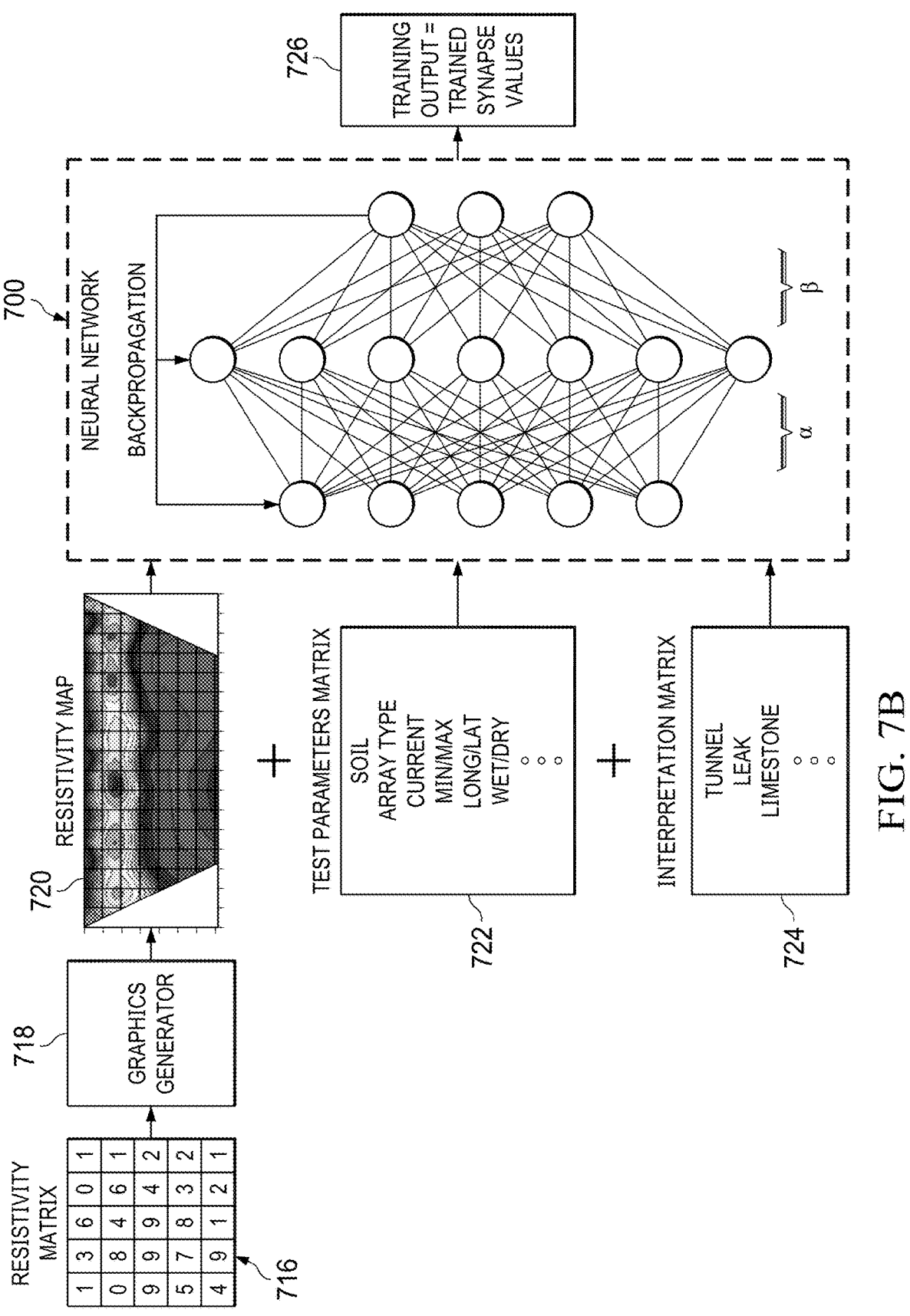
FIG. 7B is a diagram of a training process for a convolutional neural network for identifying subsurface characteristics in a resistivity map.

Referring to FIG. 7B, a preferred process for training convolutional neural network 700 will be further described.

Resistivity matrix 716 represents the resistivity data produced in an ERT survey. Resistivity matrix 716 is input into graphics generator 718 resident on the system server to produce resistivity map 720, as previously described.

Test parameters matrix 722 is comprised of the known environmental factors and the test settings utilized for the ERT survey. Examples of environmental factors include details of the physical location and geology being tested, such as the longitude and latitude coordinates, the soil type, the moisture content of the soil, the weather conditions, time of day etc. Examples of test settings include details of the ERT system being used to output the survey, such as, array type, and minimum and maximum current and voltage, as previously described. In a preferred embodiment, all test parameters are provided on a normalized scale from 0 to 1. Non-numerical parameters, such as array type and soil type, are assigned numerical values from a preferred table. For example, possible values representing array types are listed in Table 1 below.

TABLE 1

| Array | Test Parameters Matrix Value |
|---|---|
| Dipole-Dipole Array | 0.1 |
| Pole-Dipole Array | 0.2 |
| Wenner Array | 0.3 |
| Schlumberger Array | 0.4 |

As another example, soil type may be represented by the percentage of each soil type in the soil composition found at the ERT survey site, exemplary values are listed in Table 2 below. In this example, the percentages, when totaled, should equal 100%.

TABLE 2

| Soil Type | Test Parameters Matrix Value |
|---|---|
| Sand | 0.05 |
| Loam | 0.84 |
| Clay | 0.08 |
| Rock | 0.03 |

Interpretation matrix 724 is a list of probabilities that each of a set of subsurface characteristics, such as tunnels, water leak, stone, clay, minerals, oil, aquifers, etc., is present in the survey site represented by the resistivity map. In one embodiment, the interpretation matrix is manually generated based on actual knowledge of whether or not a characteristic is present. In this embodiment, the characteristic is either 100% present or 0% present based on actual samples taken and borings conducted before or after the ERT survey. In another embodiment, the interpretation matrix is a list of probabilities ranging between 0% and 100% generated based on statistical analysis and expert human interpretations of resistivity data. A combination of both scenarios may also be used. In either case, the values used for interpretation matrix 724 are considered known values. Exemplary output values and associated characteristics are shown in Table 3 below.

TABLE 3

| Characteristic | Interpretation Matrix Value |
|---|---|
| Tunnel | 20% |
| Water Leak | 5% |
| Limestone | 100% |
| Oil | 0% |
| . . . | . . . |

During training, resistivity map 720, test parameters matrix 722, and interpretation matrix 724, are concatenated and input into neural network 700 to derive a set of trained α and β synapse weights and training output 726.

During training, the known probability values in interpretation matrix 724 are compared to the derived probability values in output layer 708 to determine a margin of error. During backpropagation, the errors attributable to the α and β synapse weights are determined and the weights are adjusted, as will be further described. The convolutional neural network generates a new interpretation matrix using the new set of weights. This process is repeated until an optimal loss is achieved to minimize the margin of error. When optimal loss is achieved, the set of ideal trained α and β synapse weights, training output 726, is stored in the system server, as will be further described. Training output 726 is used in the functioning convolutional neural network, as will be further described.

Figure 7C:
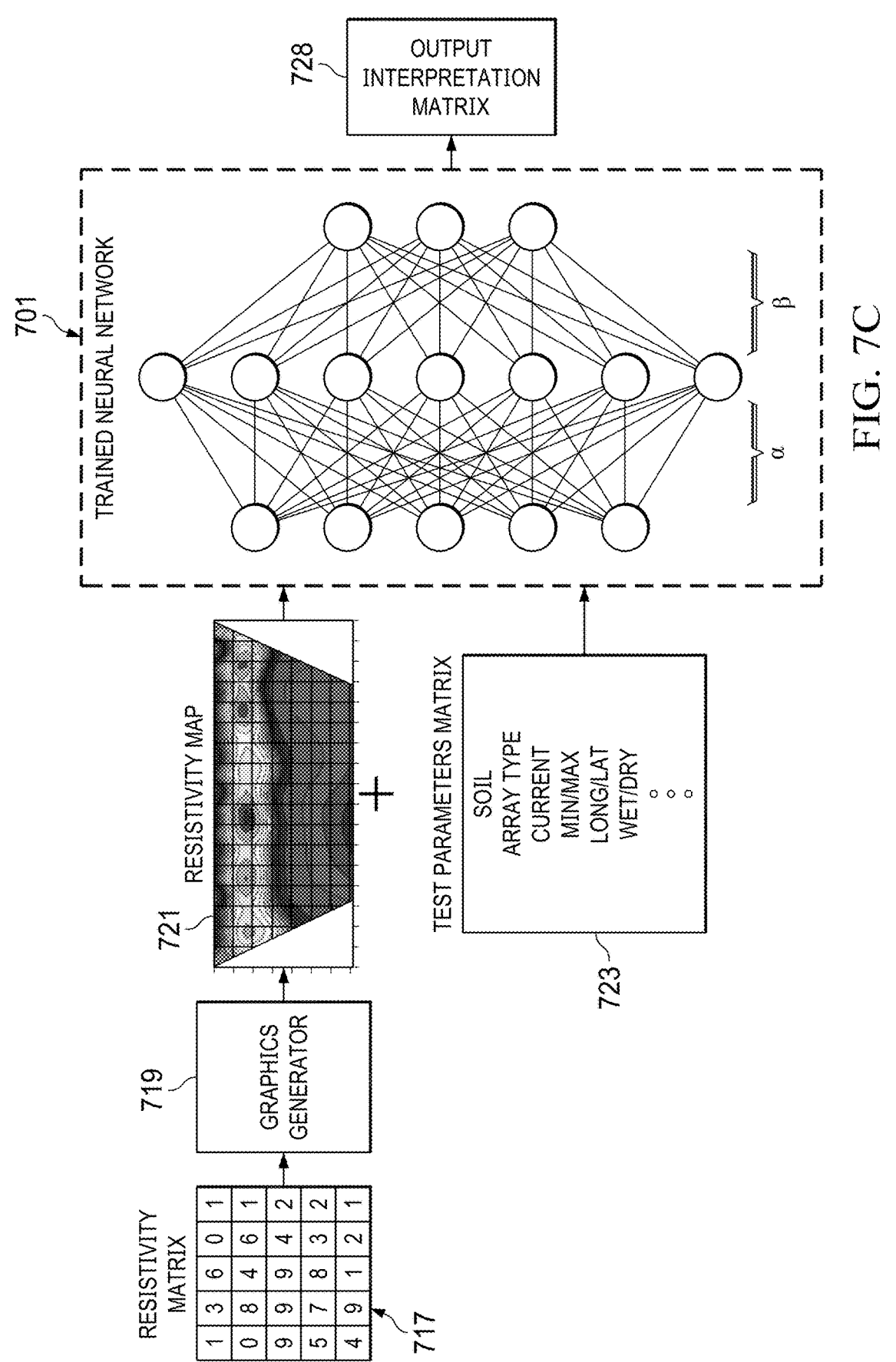
FIG. 7C is a diagram of a process of use of a trained convolutional neural network to identify subsurface characteristics in a resistivity map.

Referring then to FIG. 7C, a process of using a trained convolutional neural network 701 will be described.

Resistivity matrix 717 is input into graphics generator 719 resident on the system server to produce resistivity map 721, as previously described.

Resistivity map 721 and test parameters matrix 723 are concatenated and input into trained convolutional neural network 701 to derive output interpretation matrix 728.

Figure 7D:
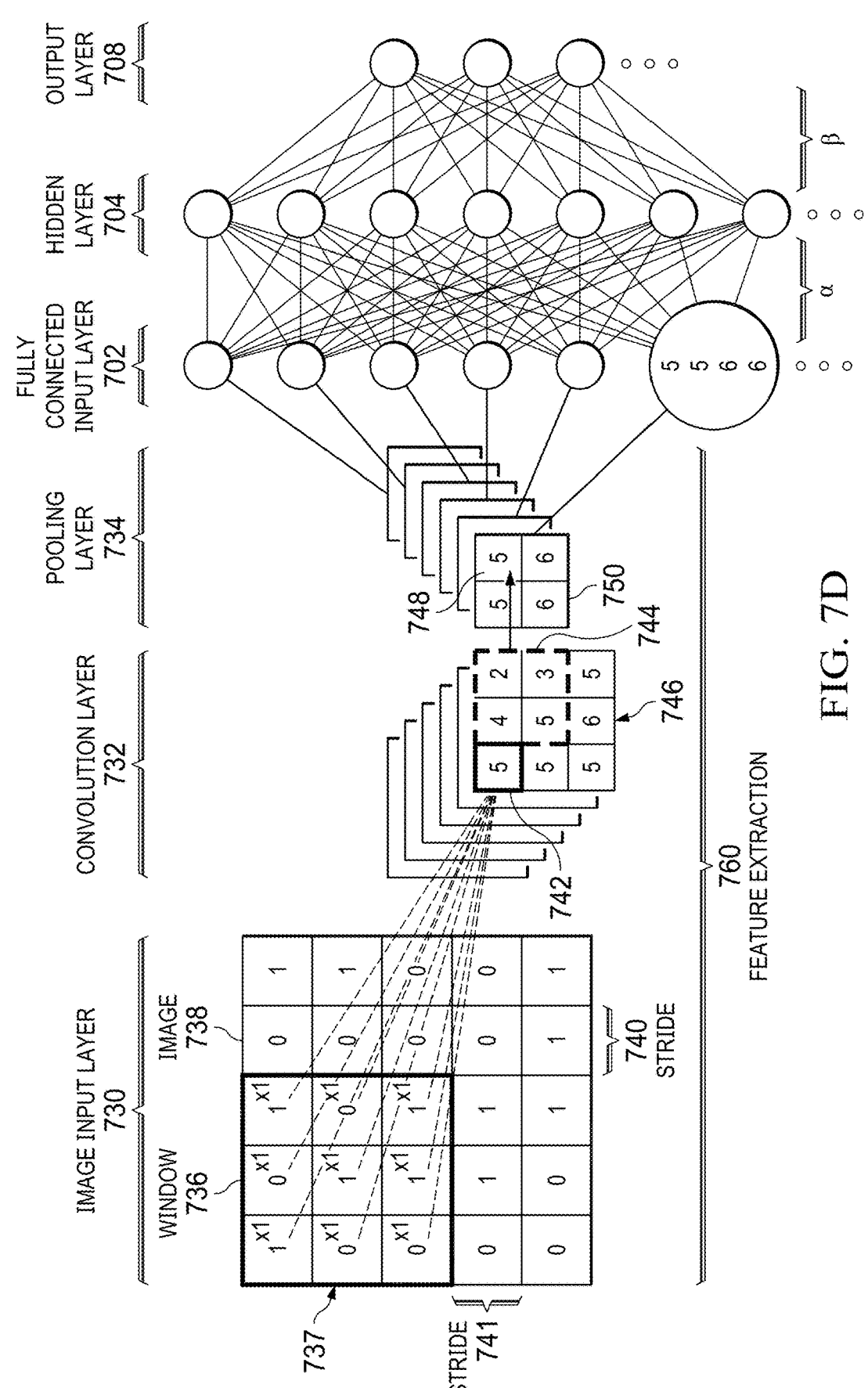
FIG. 7D is a diagram of a method for processing images in a convolutional neural network.
Figure 7E:
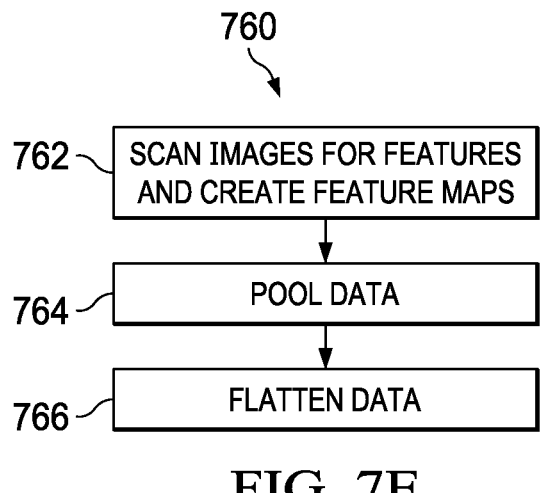
FIG. 7E is a flow chart of a method for extracting features from an image.
Figure 8A:
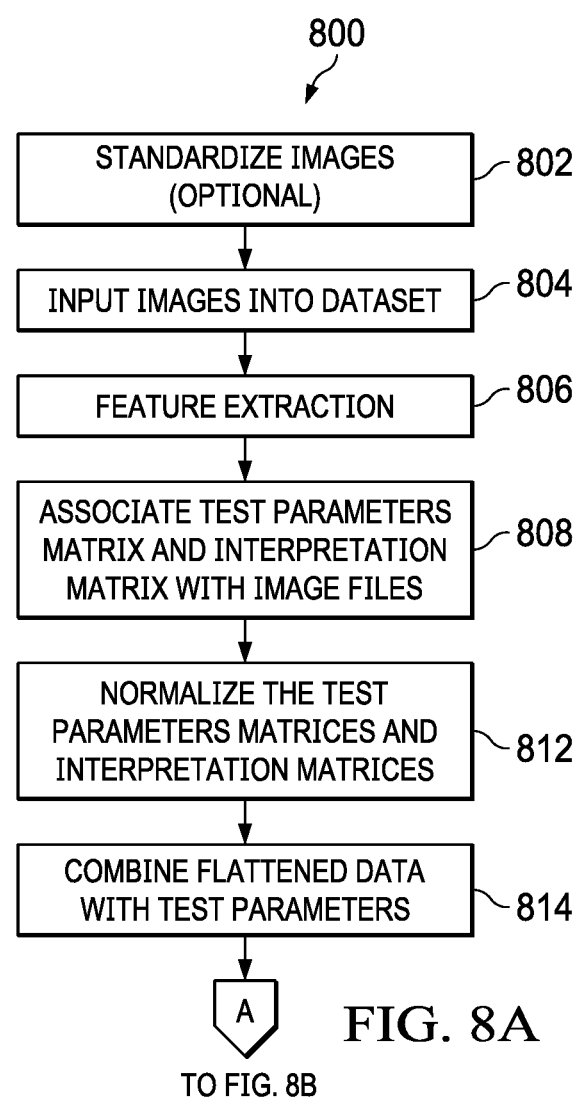

Referring then to FIGS. 7D and 7E, feature extraction method 760 for processing images for input into convolutional neural network 700 will be further described.

The processes used in feature extraction method 760 include image input layer 730, convolution layer 732, and pooling layer 734. The processes systematically extract information from the resistivity maps and format the data for input layer 702 of convolutional neural network 700.

Image input layer 730 is preferably comprised of a large data set of ordered pixels which make up a resistivity map image. Each resistivity map image is associated with one test parameters matrix. In a preferred embodiment, the input resistivity map images are the same size and format. In this illustrative example, input image 738 is a 5×5 pixel image. One of skill in the art will recognize that typical resistivity map images are comprised of a much larger pixel dimensions in order to characterize resistivity data, but convolutional neural network 700 still processes images in the same manner as explained in this example.

At step 762, each convolutional layer 732 scans the resistivity map for specific graphical features and performs a dot matrix multiplication to simplify the data to create a feature map. There may be many convolutional layers and many feature maps. Each convolution layer scans for different features in the image, such as edges, patterns, gradients, red, green, and blue, to produce a corresponding feature map, such as feature map 746. Features may include specific anomalies recognized in resistivity maps, such as tunnels and leaks. It should be appreciated that more convolution layers and feature maps may be utilized with increasing specificity in feature extraction.

In this example, feature map 746 is a 3×3 pixel matrix created by scanning regions of input image 738 using feature window 736. A feature window is defined as a set number of pixels per region used to examine an image. In this example, feature window 736 is configured to determine whether or not the section of the image examined has a single value, such as the color red, represented as the digit 1. Feature window 736 is configured as follows:

| 1 | 1 | 1 |
|---|---|---|
| 1 | 1 | 1 |
| 1 | 1 | 1 |

Different feature windows may be configured in alternate ways to look for various features. For instance, a feature window searching for a vertical line may be configured as follows:

| 0 | 1 | 0 |
|---|---|---|
| 0 | 1 | 0 |
| 0 | 1 | 0 |

Feature window 736 is overlayed on region 737 of image 738 in a bitwise multiplication. In region 737, red is represented by 1 and non-red is 0. Region 737 is represented below:

| 1 | 0 | 1 |
|---|---|---|
| 0 | 1 | 0 |
| 0 | 1 | 1 |

Feature window 736 moves across image 738 by defined horizontal stride 740 and vertical stride 741, which are both one pixel. Other stride dimensions may be used. The stride is the unit length that the window is moved horizontally and vertically for each region. The convolution layer scans the entire image by region, moving window 736 horizontally by stride 740 until all pixel columns are considered and then advancing downward by stride 741 to repeat scanning horizontally until all columns and rows are considered. As the window moves across the image, a matrix multiplication of the window and the image is computed and stored in the appropriate region position of the feature map.

For instance, feature window 736 examines region 737 for the color red to produce region 742 of feature map 746. Region 742 is calculated as follows:

$$(1\times1)+(0\times1)+(1\times1)+(0\times1)+(1\times1)+(0\times1)+(0\times1)+(1\times1)+(1\times1)=5$$

At step 764, pooling layer 734 is used to compress the spatial information for each feature map and reduce overfitting the network. The feature maps are compressed in the same order that they were created. In this example, pooling layer 734 scans feature map 746 using exemplary window 744 to produce pooled feature map 750. Window 744 is a 2×2 matrix window. The window moves across feature map 746 horizontally by a stride of one and then vertically by a stride of one until all regions are considered. In this example, a "stride" includes a single column width and row height. In this example, window 744 is configured to compress the values of the feature map into four regions using max pooling. In "max pooling" the maximum value in the window is located and transferred to the corresponding region of the pooled feature map. In this example, region 748 results from window 744 and is "5". In an alternate embodiment, "average pooling" may be used, which takes the average value in a region.

In yet another embodiment, "global feature mapping" is utilized to produce uniform compressed feature maps in pooling layer 734. By using global feature mapping, convolutional neural network 700 is able to accept images of different sizes, such as with various array sizes. However, global feature mapping is more computationally expensive. Thus, in a preferred embodiment, images are reduced to a standard size before being input into the neural network to increase efficiency. In a preferred embodiment, the images are reduced to the same size but still contains images representing resistivity surveys conducted using various array sizes and data representing the array size and configuration are input into a fully connected input layer. In another embodiment, a different neural network may be employed for each different size or configuration of resistivity maps in order to standardize the number of input values.

It will be appreciated by those skilled in the art that other configurations of window size, stride size, number of feature maps, convolutional layers, and pooling layers may be employed to gain the advantages of the invention.

At step 766, the pooled data is flatted into a single column matrix. "Flattening" the data arranges the rows and columns into a single column matrix. Pooled feature maps are flattened in the same order as their corresponding feature maps are created. Each pooled feature map is parsed out according to a set directionality, generally left to right top to bottom. In this example, the values from pooled feature map 750 are flattened into a 4×1 matrix from left to right top to bottom. So in this example, the values from six (6) maps in pooling layer 734 would be flattened into a 24×1 matrix representing of all the extracted features present in the image.

In a preferred embodiment, the values for the test parameters matrix associated with a single resistivity map are appended to the end of the flattened data to form a single column matrix to completely populate the input layer. The data is then fed forward through convolutional neural network 700, as will be further described.

In a preferred embodiment, the system uses transfer learning to accelerate training the neural network. Transfer learning utilizes a pretrained convolutional neural network, such as MobileNet V2 trained on the MNIST database, for feature extraction method 760. The benefit of transfer learning is that a model trained on a large dataset can skip learning standard features needed for image recognition, such as numbers, color, edges, patterns, and gradients, and additional features specific to the purpose are integrated and trained, such as resistivity, tunnels, and leaks. The network can then be trained on a large dataset of resistivity maps linked with associated test parameters.

It should be appreciated that different configurations of the number of convolution and pooling layers may be used. Similarly, any configuration of hyperparameters such as the number of hidden layers, the number of neurons per hidden layer, and type of activation function may be used to gain the advantages of the invention.

Referring then to FIGS. 7, 8A, 8B, and 8C, a flow chart of method 800 for training convolutional neural network 700 will be described.

At step 802, optionally, resistivity maps are standardized to a specified size and format.

At step 804, the images are stored in a specified dataset for the convolutional neural network. In a preferred embodiment, 10,000 to 20,000 images are required to approach an optimal set of synapse values.

At step 806, features are extracted from a resistivity image and the data is flattened according to feature extraction method 760, as previously described.

At step 808, a test parameters matrix and an interpretation matrix are associated with each image file.

Example test parameters matrices and interpretation matrices are shown in Table 4. For this example, the probability values are input on a scale of 0-100% that a subsurface characteristic is present in Resistivity Map 'X'. Each test parameter matrix and interpretation matrix are associated with a single resistivity map.

TABLE 4

| Resistivity Map (x) | Test Parameters Matrix (y) | Interpretation Matrix (z) |
|---|---|---|
| 1 | [21, 6, 7.5, 30, 150, . . . ] | [10, 45, 75, 22, 85, 0 . . . ] |
| 2 | [76, 500, 350, 36, 220 . . . ] | [13, 23, 90, 62, 33, 24 . . . ] |
| 3 | [21, 36, 50, 70, 10, . . . ] | [86, 35, 68, 29, 52, 12 . . . ] |
| . . . | . . . | . . . |
| x | $[y_{1n}, y_{2n}, y_{3n}, y_{4n}, y_{5n},$ . . . ] | $[z_{1n}, z_{2n}, z_{3n}, z_{4n}, z_{5n}, z_{5n},$ . . . ] |

At step 812, the test parameters matrices and the interpretation matrices are normalized to a value between 0 and 1 by dividing each variable by the maximum permitted value of the variables.

At step 814, the flattened image data is combined with the normalized test parameters to form a fully connected input layer. In a preferred embodiment, for each flattened image file the associated test parameters column matrix is appended to the end of the flattened data.

At step 828, each of the α synapses are assigned a random weight, $\alpha_n$, between 0 and 1. At step 830, each of the β synapses are assigned a random weight, $\beta_n$, between 0 and 1.

At step 832, the input layer values and the α synapse weights are multiplied in a matrix operation and summed to determine a first set of hidden values, μ, for each node n in hidden layer 704, according to the following equation:

$$\mu_{mn} = \Sigma IV_n \times \alpha_m \qquad \text{Eq. 1}$$

where:
n=number of input layer nodes; and
m=number of hidden nodes.

At step 834, the activation function is applied to the first set of hidden values, μ, to derive the final hidden value of the node, HV. In a preferred embodiment, the activation function is the Sigmoid function. The Sigmoid function is preferred because its derivative can be efficiently calculated. The activation function is shown below:

$$HV_n = S(\mu_{mn}) = \frac{1}{1+e^{-\mu_{mn}}} = \frac{e^{\mu_{mn}}}{e^{\mu_{mn}}+1} \qquad \text{Eq. 2}$$

where:

$\mu_n$ is the first value of the nodes in the hidden layer; and
$HV_n$ is the final hidden value of the hidden layer nodes.

At step 836, the values $HV_n$ and the β synapse weights are multiplied in a matrix operation and summed to determine the first value, γ, for the nodes in output layer 708, according to the following equation:

$$\gamma = \Sigma HV_n \times \beta_m \qquad \text{Eq. 3}$$

At step 838, the activation function is applied to the value, γ, calculated in step 836 to produce the output values for output layer 708. The output values are the predicted probability that a subsurface characteristic is present, as previously described.

In steps 840-852, during training the neural network backpropagates to minimize Error, as will be further described.

At step 840, the error in the output is calculated using a mean sum squared loss function. The mean sum squared loss function is the sum for all data points of the square of the difference between the predicted and actual target values divided by the number of sets of data, according to the following equation:

$$Error = \sum \frac{(Output_n - z_n)^2}{n} \qquad \text{Eq. 4}$$

where:
Output$_n$ is the predicted probability of a subsurface characteristic; and
$Z_n$ is the known probability value input in the system in step 814.

At step 842, the margin of error of output layer 708, error margin, is calculated according to the following equation:

$$\text{Error Margin} = y_n - Output_n \qquad \text{Eq. 5}$$

At step 844, the delta output sum for output layer 708, $\Delta_1$, is calculated. The delta output sum, $\Delta_1$, is calculated by applying the derivative of the sigmoid activation function to the output error calculated in step 840. The derivative of the sigmoid activation function for an output of "x" is x(x−1).

At step 846, the error attributable to hidden layer 704, the hidden error, is determined. The hidden error is calculated by calculating the dot product of the delta output sum, $\Delta_1$, and the β synapse weights.

At step 848, the delta output sum for hidden layer 704, $\Delta_2$, is calculated by applying the derivative of the sigmoid activation function to the hidden error calculated in step 846, as previously described.

At step 850, the a synapse weights are adjusted by calculating the dot product of input layer 702 nodes and the delta output sum, $\Delta_2$. At step 852, the β synapse weights are adjusted by calculating the dot product of hidden layer 704 nodes and the delta output sum, $\Delta_1$. The adjusted weights are returned, and the neural network uses the new weights in the next training iteration. When the network has trained the preset number of iterations the weights are fixed at the values with the lowest mean sum squared loss error.

At step 854, an automatic evaluation of the trained model is performed and plotted to determine the overall performance of the trained model.

Steps 832 through 854 are repeated for a preset number of iterations until the convolutional neural network is trained. In a preferred embodiment, a preset number of iterations is used, anywhere from 10,000 to 200,000. Once the system executes the number of iterations, the neural network is considered "trained" and the ideal values of α and β synapses are stored. In an alternate embodiment, if an ideal error, such as 0.01%, is achieved prior to executing all iterations, the neural network is similarly considered trained. Other iterations counts and ideal errors may be used. A higher iteration count reduces the Error and increases the accuracy of the synapse weights.

At step 858, the synapse weights are stored in the database when training is complete. At step 860, training ends and the convolutional neural network is updated.

Referring then to FIG. 8D, method 801 for running trained convolutional neural network 701 will be described.

At step 862, a new ERT survey is conducted and raw resistivity data is transmitted to the system server, as previously described.

At step 864, a new test parameters matrix is generated, as previously described. At step 866, the resistivity data is processed through the graphics generator to generate a resistivity map, as previously described.

At step 872, the resistivity map is processed through feature extraction method 760, as previously described. At step 874, the flattened data extracted in step 872 is combined with the test parameters to form a fully connected input layer. In a preferred embodiment, the test parameters matrix values are appended to the end of the flattened data as a normalized column matrix.

At step 876, the input layer values and the trained α synapse weights are multiplied in a matrix operation and summed to determine a first set of hidden values, μ, for each node n in hidden layer 704, according to equation 1, as previously described.

At step 878, the activation function is applied to the first set of hidden values, μ, to derive the final hidden value of the node, HV. In a preferred embodiment, the activation function is the Sigmoid function shown in equation 2.

At step 880, the values HV$_n$ and the trained β synapse weights are multiplied in a matrix operation and summed to determine the first value, γ, for the nodes in output layer 708, according to equation 3, as previously described.

At step 882, the activation function is applied to the value, γ, calculated in step 880 to produce the output values for output layer 708. The output values are the predicted probability that a subsurface characteristic is present, as previously described.

At step 884, the system server generates output interpretation matrix 728 using the output values calculated in step 882. The output interpretation matrix list each characteristic and the associated output probability value, that is, the probability that the specified characteristic is present in the resistivity map.

At step 886, the output interpretation matrix is stored in the system server and returned to the client device or administrator device.

An example of computer code written in Python to perform one example of the method is shown in FIGS. 9A and 9B. Of course, other code may be used to implement this and other embodiments of the convolutional neural network described.

Referring then to FIG. 9A, at lines 1-11, the libraries used to run the convolutional neural network are imported. At line 2, Tensorflow is imported to train the neural network. In this example, at line 3, the MNIST dataset is imported from the Keras library to train the convolutional neural network using transfer learning. Additional or different datasets and libraries may be imported and used to achieve similar results. At line 4, the PIL method is called to import the user created dataset into the network.

At lines 5-10, the Keras methods used to build the convolutional network are imported. The method Dense includes the methods for activation functions. The Conv2D method builds the convolutional layers which search for specific features in an image. The Flatten method flattens the extracted values from the image into a single column matrix. MaxPooling2D reduces the special dimensions of the extracted data.

At line 11, the NumPy library is imported to perform advanced mathematical functions, such as matrix multiplication, which is needed for neural networks.

At lines 14-15, a random seed is setup to control the starting point of the randomly assigned weight values to control the evolution of the neural network.

At line 19, the number of subsurface characteristics, interpretations, are defined. In this example, the number of subsurface characteristics is listed as 10, though the system can be created to define more or less subsurface characteristics.

At line 20, the image size is defined as 28×28 pixels. This is only an example, a preferred resistivity map image size is 250×1500 pixels.

At lines 24-26, the datasets are imported and split into train and test sets. At lines 25-26, the images are optionally resized.

At lines 31-32, the image set is converted to a float data type. At lines 35-36, the images are rescaled, or normalized between 0 and 1.

At lines 39-40, the test parameters are returned in a binary matrix.

At lines 42-43, the interpretation matrix is returned in a binary matrix.

Referring then to FIG. 9B, at line 48, a first convolutional layer is defined. In this example the convolutional layer is set to filter for 32 features in an image, using a 3×3 pixel window, a stride of 1, and utilizes the sigmoid function to normalize the data. However, different numbers and sizes of filters, and other activation functions may be utilized. At line 50, the max pooling method is defined as a 2×2 matrix.

At lines 53-55, a secondary convolutional layer and pooling layer are defined. In this example, the second convolutional layer is set with a larger number of filters. More or less convolutional layers and pooling layers may be utilized, as previously described.

At lines 57-60, the data is flattened and normalized using a sigmoid activation function. At line 63, the method Dropout is used with a rate of 0.5 to discard datapoints in order to reduce overfitting the convolutional neural network.

At line 66, the system converts the output into a probability that a subsurface characteristic is shown in the image, the interpretation matrix. At line 69, the system is compiled and the performance is measured.

At lines 72-73, the model is trained for 150,000 epochs. At line 75, the loss is calculated as a score for the performance of the convolutional neural network.

At lines 78-80, the test performance is printed for review.

At lines 83-86, the neural network is run and the predicted interpretation matrix and the input test parameters matrix are printed for review.

At line 83, the neural network is run and results are printed. At line 86, actual test results are printed.

Figure 10A:
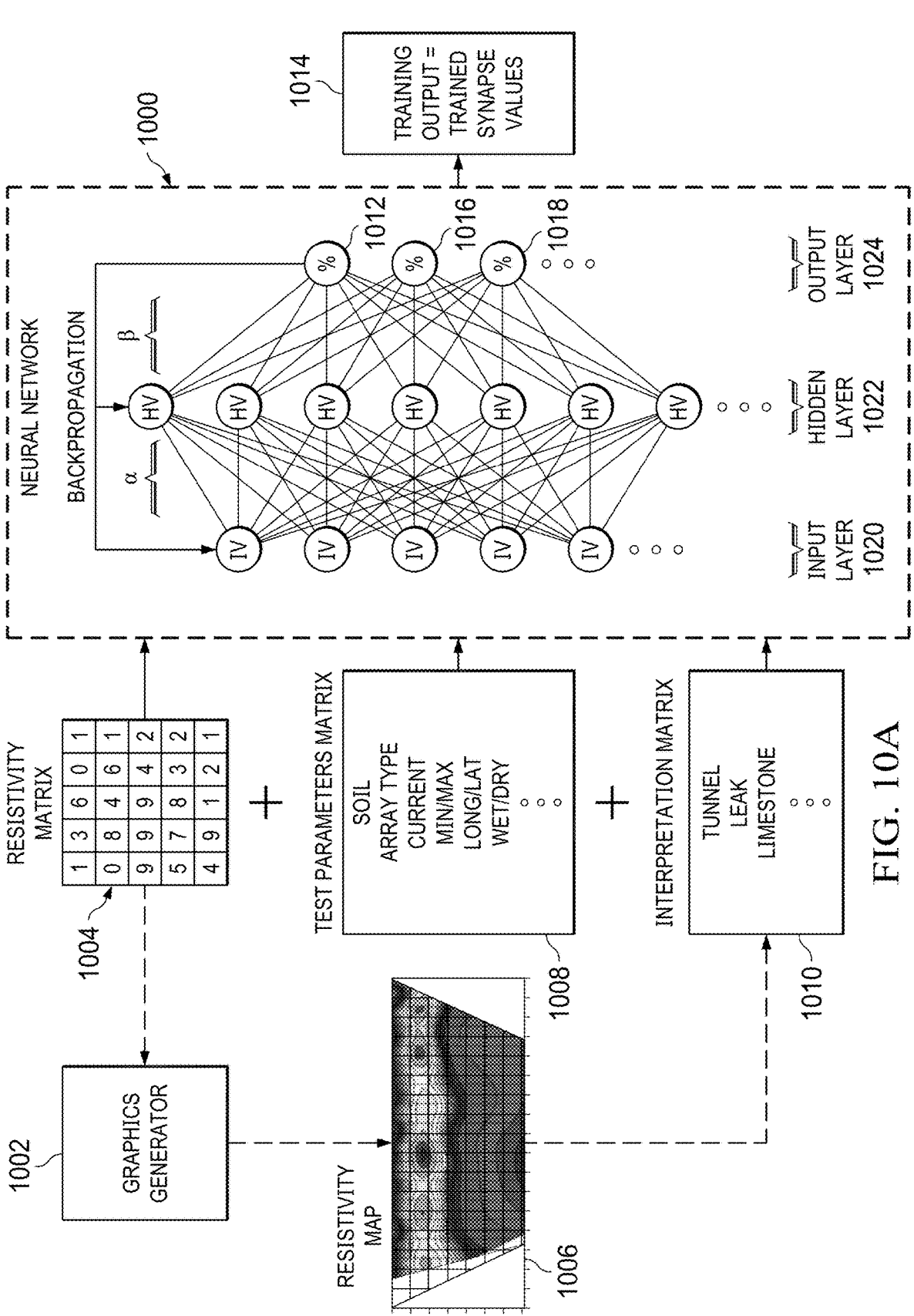
FIG. 10A is a diagram of a training process for an artificial neural network to identify subsurface characteristics based on a resistivity model.

Referring then to FIG. 10A, a preferred embodiment of a process for training an artificial neural network for interpreting subsurface characteristics from raw resistivity data and test parameters will be further described. Artificial neural network 1000 includes input layer 1020, hidden layer 1022, and output layer 1024. Other numbers of nodes and layers may be used, as previously described.

Input layer 1020 has one node for each input value (IV) considered in interpreting a resistivity data. The input values considered in input layer 1020 are obtained from resistivity matrix 1004 and test parameters matrix 1008, as will be further described.

Each node of input layer 1020 is connected to each node of hidden layer 1022 via α synapses having an assigned weight between 0 and 1. The input layer nodes are multiplied by the α synapses, summed, and processed using an activation function to produce a hidden value, HV, for hidden layer nodes, as will be further described.

Hidden layer 1022 is comprised of a plurality of weighted nodes. Hidden layer 1022 preferably includes a bias node. Each node of hidden layer 1022 is connected to output layer 1024 by β synapses assigned a weight between 0 and 1. The nodes of hidden layer 1022 are multiplied by β synapses, summed, and processed using an activation function to produce the output probability values for output layer 1024, as will be further described.

In this example, output layer 1024 is shown with three (3) nodes 1012, 1016, and 1018, representing the probabilities that three different subsurface characteristics are present.

During training, resistivity matrix 1004, test parameters matrix 1008, and interpretation matrix 1010, are input into artificial neural network 1000 to derive of trained α and β synapse weights, training output 1014, as will be further described.

In a preferred embodiment, resistivity matrix 1004 is input into graphics generator 1002 resident on the system server to produce resistivity map 1006. In one embodiment, resistivity map 1006 is processed through the convolutional neural network to derive interpretation matrix 1010 to train neural network 1000. In another embodiment, the resistivity map is manually interpreted to derive interpretation matrix 1010.

During training, the known probability values in interpretation matrix 1010 are compared to the derived probability values in output layer 1024 to determine a margin of error and the α and β synapse weights are adjusted through backpropagation, as will be further described. When optimal loss is achieved, the set of ideal trained α and β synapse weights, training output 1014, is stored in the system server and used in the functioning artificial neural network, as will be further described.

Figure 10B:
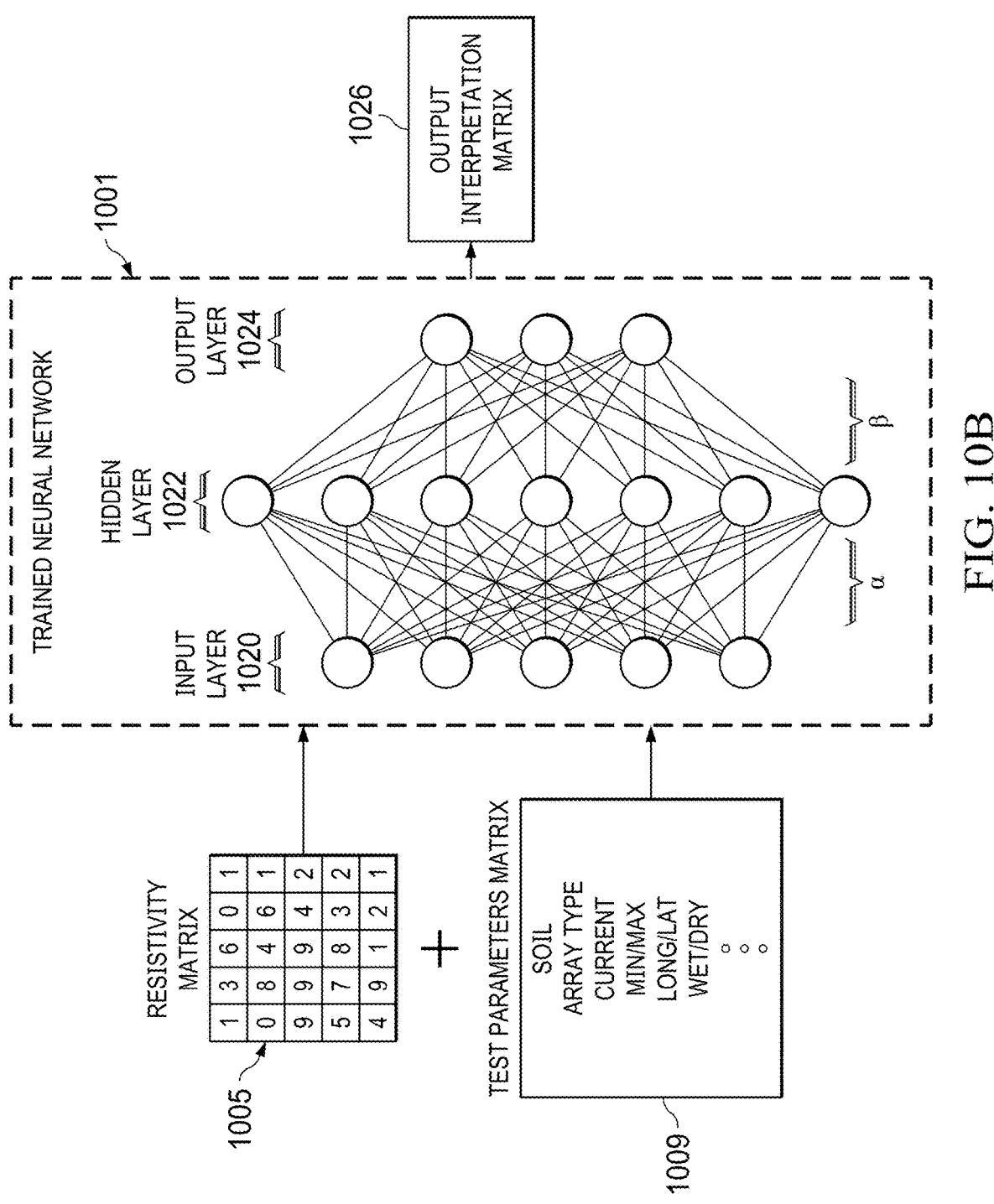
FIG. 10B is a diagram of a process of use of a trained artificial neural network for identifying subsurface characteristics based on a resistivity model.

Referring then to FIG. 10B, a process of use of trained artificial neural network 1001 will be described.

Resistivity matrix 1005 and test parameters matrix 1009 are input into trained artificial neural network 1001 to derive interpretation matrix 1026. In one embodiment, trained neural network 1001 includes input layer 1020. Input layer 1020 is operatively connected to hidden layer 1022 by synapses α. Hidden layer 1022 is connected to output layer 1024 by synapses β. The output layer produces output interpretation matrix 1026. The output interpretation matrix provides a set of probability values that each specified characteristic, such as a leak or a tunnel, is present in the subsurface geology that produced the resistivity matrix. Notably, the necessity to generate a resistivity map is eliminated in this embodiment, drastically reducing computational cost required and increasing the speed at which an interpretation of subsurface features can be made.

Figures 11A, 11B:
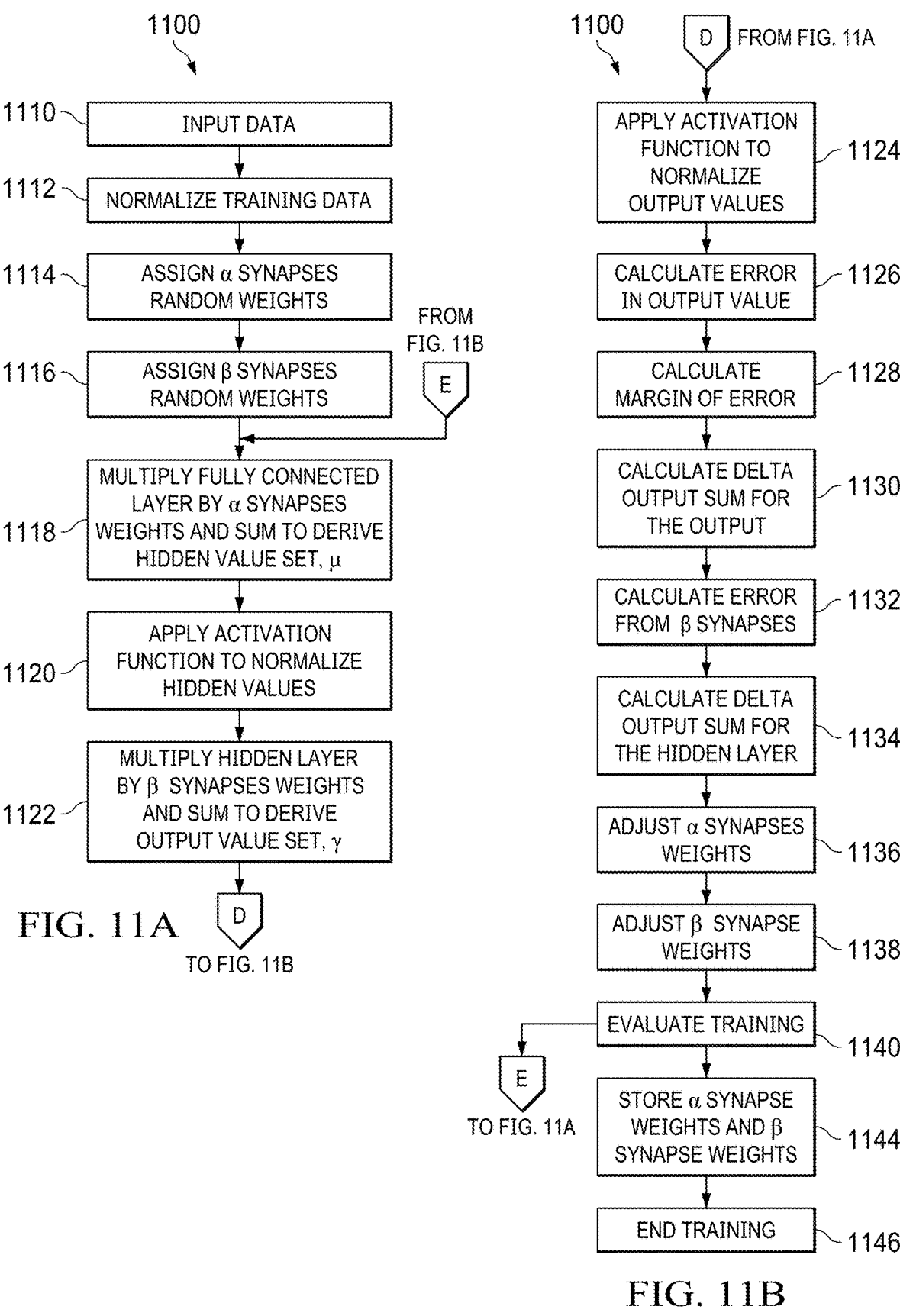
FIGS. 11A and 11B is a flow chart of a method for training and using an artificial neural network to recognize subsurface characteristics in a resistivity model.

Referring then to FIGS. 11A and 11B, a flow chart of method 1100 for training artificial neural network 1000 will be described.

At step 1110, training data is input into the artificial neural network. The training data is supplied to the algorithm as sets of single column matrices representing the resistivity matrix, the test parameters matrix, and the interpretation matrix, as previously described. In a preferred embodiment, in each dataset, the test parameters matrix is appended to the end of the resistivity matrix to form a single $n \times 1$ matrix.

At step 1112, in a preferred embodiment, all of the values input in step 1110 are normalized to a value between 0 and 1 by dividing each variable by the maximum permitted value of the variables.

At step 1114, each of the α synapses are assigned a random weight, $\alpha_n$, between 0 and 1. At step 1116, each of the β synapses are assigned a random weight, $\beta_n$, between 0 and 1.

At step 1118, the input layer values and the α synapse weights are multiplied in a matrix operation and summed to determine a first set of hidden values, $\mu$, for each node n in hidden layer 1022 according to equation 1, as previously described.

At step 1120, the sigmoid activation function is applied to the first set of hidden values, $\mu$, to derive the final hidden value of the node, HV, using equation 2, as previously described.

At step 1122, the values $HV_n$ and the β synapse weights are multiplied in a matrix operation and summed to determine the first value, $\gamma$, for the nodes in output layer 1024, according to equation 3, as previously described.

At step 1124, the activation function is applied to the value, $\gamma$, calculated in step 1122 to produce the output values for output layer 1024. The output values are the predicted probability that a subsurface characteristic is present, as previously described.

In steps 1126-1138, during training the neural network backpropagates to minimize Error, as will be further described.

At step 1126, the error in the output is calculated using a mean sum squared loss function according to equation 4, as previously described.

At step 1128, the margin of error of output layer 1024 is calculated according to equation 5, as previously described.

At step 1130, the delta output sum for output layer 1024, $\Delta_1$, is calculated by applying the derivative of the sigmoid activation function to the output error calculated in step 1126, as previously described.

At step 1132, the error attributable to hidden layer 1022, the hidden error, is determined. The hidden error is calculated by calculating the dot product of the delta output sum, $\Delta_1$, and the β synapse weights.

At step 1134, the delta output sum for hidden layer 1022, $\Delta_2$, is calculated by applying the derivative of the sigmoid activation function to the hidden error calculated in step 1132, as previously described.

At step 1136, the a synapses weights are adjusted by calculating the dot product of input layer 1020 nodes and the delta output sum, $\Delta_2$. At step 1138, the β synapses weights are adjusted by calculating the dot product of hidden layer 1022 nodes and the delta output sum, $\Delta_1$. The adjusted weights are returned, and the neural network uses the new weights in the next training iteration. When the network has trained the preset number of iterations, the weights are fixed at the values with the lowest mean sum squared loss error.

At step 1140, an automatic evaluation of the trained model is performed and plotted to determine the overall performance of the trained model.

Steps 1118 through 1140 are repeated for a preset number of iterations or until an acceptable margin of error is reached.

At step 1144, the ideal values of the synapse weights are stored in the database when training is complete. At step 1146, training ends and the artificial neural network is updated.

Referring then to FIG. 11C, method 1101 for using trained artificial neural network 1001 will be described.

At step 1150, a new ERT survey is conducted and transmitted to the system server, as previously described.

At step 1151, the resistivity data is normalized to a scale of between 0 and 1.

At step 1152, a new test parameters matrix is generated. In a preferred embodiment, the test parameters are provided on a 0 to 1 scale, as previously described.

At step 1154, the resistivity matrix is appended to the test parameters matrix to form a dataset.

At step 1156, the input layer values and the trained α synapse weights are multiplied in a matrix operation and summed to determine a first set of hidden values, μ, for each node n in hidden layer 1022, according equation 1.

At step 1158, the activation function is applied to the first set of hidden values, μ, to derive the final hidden value of the node, HV. In a preferred embodiment, the activation function is the Sigmoid function shown in equation 2.

At step 1160, the values $HV_n$ and the trained β synapse weights are multiplied in a matrix operation and summed to determine the first value, γ, for the nodes in output layer 1024, according to the equation 3.

At step 1162, the activation function is applied to the value, γ, calculated in step 1160 to produce the output values for output layer 1024. The output values are the predicted probabilities that specific subsurface characteristics are present, as previously described.

At step 1164, the system server generates output interpretation matrix 1026 using the output values calculated in step 1162. The output interpretation matrix list each characteristic and the associated output probability value.

At step 1166, the output interpretation matrix is stored in the system server and returned to the client device or administrator device.

An example of computer code written in Python to perform one example of the method is shown in FIGS. 12A and 12B. Of course, other code may be used to implement this and other embodiments of the artificial neural network described.

Referring then to FIG. 12A, at line 1, the NumPy library is imported to perform advanced mathematical functions, such as matrix multiplication, which is needed for neural networks. Additional or different libraries may be imported and used, such as Tensorflow and Keras.

At lines 3-7, the training data is input as a matrix. As an example, four (4) sets of resistivity matrix values and test parameter values, x, are input and three (3) sets of interpretation probability values, y are included. In practice between 1,000 and 25,000 data sets would be employed to train each neural network.

At lines 9-10, the data is scaled by dividing the x array by its maximum value and they array by 100, or the maximum possible probability value input. At lines 13-15, the data is split into training and testing data. In this example, the first three sets of data are used to train the neural network. Once training is complete, the neural network is tested by deriving an interpretation matrix for the fourth set of resistivity matrix and test parameter data.

At lines 17-23, the neural network is created. In this example, the network has one input layer with ten (10) nodes, one output layer with eight (8) nodes, and one hidden layer with eleven (11) nodes.

At lines 25-27, the α synapse and β synapse weights are defined as 11×10 and 11×8 arrays, respectively, and assigned random values.

At lines 29-35, a forward propagation function is defined. When called, the forward propagation function executes steps 1118 through 1124, as previously described. At lines 36-38, the sigmoid activation function is defined. At lines 40-42, the derivative of the sigmoid activation function is defined.

Referring then to FIG. 12B, at lines 44-53, the backpropagation function is defined. When called, the back propagation function executes steps 1126 through 1138, as previously described.

At lines 55-58, the system is set to train by using forward propagation to produce an output. At lines 60-63, the system is set to save the synapse weights. At lines 65-69, the system is set to print the interpretation matrix input and the resulting predicted probability of a subsurface characteristic being present after the neural network is trained.

At lines 71-84, the system runs the neural network until it is trained. In this example the system will run 150,000 iterations of training unless an ideal loss of 0.001% is achieved. In this example, during training, the neural network is set to print the scaled input, actual output, predicted output, and mean sum squared loss for each iteration run. Once the network is trained, at line 86, the system saves the ideal synapse weights.

At line 87, the system returns an interpretation matrix for the fourth set of input data.

The invention claimed is:

1. A system for interpreting resistivity data comprising:
a system server;
a processor in the system server
a memory operatively connected to the processor;
the memory, including a set of instructions that, when executed, causes the system to perform the steps of:
  receiving a set of resistivity data; and,
  generating a set of interpretation probabilities from the set of resistivity data;
instantiating a convolutional neural network;
deriving a training set of interpretation probabilities from the convolutional neural network;
instantiating an artificial neural network;
training the artificial neural network with the training set of interpretation probabilities;
receiving a set of test parameters associated with the set of resistivity data; and,
generating the set of interpretation probabilities from the set of resistivity data and the set of test parameters.

2. The system of claim 1 wherein the set of test parameters is comprised of one of the group of longitude, latitude, weather, array type, soil type, current, voltage, humidity, and soil moisture.

3. The system of claim 1 further comprising a graphics generator resident on the system server, and the set of instructions further comprising the steps of:
generating, by the graphics generator, a resistivity map based on the set of resistivity data.

4. The system of claim 3 further comprising:
a convolutional neural network, resident on the system server, comprised of:
  an image input layer, having a first set of nodes, corresponding to the resistivity map;
  a convolutional layer, having a set of extracted feature maps, connected to the image input layer;

a pooling layer, having a set of compressed feature maps corresponding to the set of extracted feature maps, connected to the convolutional layer;

an input layer, having a second set of nodes, corresponding to a number of values in the set of compressed feature maps and the set of test parameters, connected to the pooling layer;

a hidden layer, having a third set of nodes, connected to the input layer; and, an output layer, having a fourth set of nodes, corresponding to a set of values related to the set of interpretation probabilities, connected to the hidden layer.

5. The system of claim 4 wherein the step of generating the set of interpretation probabilities further comprises training the convolutional neural network by the steps of:

receiving a training resistivity map having a plurality of training image pixels;

receiving a training set of test parameters;

receiving a set of known interpretation probabilities associated with the training resistivity map;

setting a first set of values for a first set of synapse weights;

setting a second set of values for a second set of synapse weights;

moving a first local window across a first plurality of sub-regions of the training resistivity map to obtain a first plurality of sub-region pixel sets associated with each extracted feature map of the set of extracted feature maps;

moving a second local window across a second plurality of sub-regions of the set of extracted feature maps to obtain a second plurality of sub-region pixel sets associated with each compressed feature map of the set of compressed feature maps;

translating the set of compressed feature maps into a first column matrix;

appending the training set of test parameters to the first column matrix;

calculating a first set of hidden values for the hidden layer by multiplying the first column matrix by the first set of synapse weights and normalizing;

calculating a set of output interpretation probabilities by multiplying the first set of hidden values with the second set of synapse weights and summing a first set of normalized node values;

comparing the set of output interpretation probabilities to the set of known interpretation probabilities;

calculating an error in the set of output interpretation probabilities due to the first set of synapse weights;

calculating an error in the first set of hidden values due to the second set of synapse weights;

adjusting the first set of synapse weights to create a third set of synapse weights; and, adjusting the second set of synapse weights to create a fourth set of synapse weights to produce a trained convolutional neural network.

6. The system of claim 5 wherein the step of generating the set of interpretation probabilities further comprises the steps of:

moving a third local window across a third plurality of sub-regions of the resistivity map to obtain a third plurality of sub-region pixel sets associated with each extracted feature map of the set of extracted feature maps;

moving a fourth local window across a fourth plurality of sub-regions of the set of extracted feature maps to obtain a fourth plurality of sub-region pixel sets associated with each compressed feature map of the set of compressed feature maps;

translating the set of compressed feature maps into a second column matrix;

appending the set of test parameters to the second column matrix;

calculating, by the trained convolutional neural network, a second set of hidden values for the hidden layer by multiplying the second column matrix by the third set of synapse weights and normalizing; and, calculating, by the trained convolutional neural network, the set of interpretation probabilities by multiplying the second set of hidden values with the fourth set of synapse weights and summing a second set of normalized node values.

7. The system of claim 1 further comprising:

an artificial neural network, resident on the system server, comprised of:

an input layer having a first set of nodes corresponding to the set of resistivity data and the set of test parameters;

a hidden layer, connected to the input layer by a first set of synapses, having a second set of nodes; and, an output layer, connected to the hidden layer by a second set of synapses, corresponding to the set of interpretation probabilities.

8. The system of claim 7 wherein the step of generating the set of interpretation probabilities further comprises the step of training the artificial neural network by:

receiving a set of training resistivity data;

receiving a set of training test parameters associated with the resistivity data;

receiving a set of known interpretation probabilities for the set of training resistivity data and the set of training test parameters;

appending the set of training test parameters to the set of training resistivity data to form a first column matrix;

setting a first set of values for a first set of synapse weights, corresponding to the first set of synapses;

setting a second set of values for a second set of synapse weights, corresponding to the second set of synapses;

calculating a first set of hidden values for the hidden layer by multiplying the first column matrix by the first set of synapse weights and normalizing;

calculating a set of output interpretation probabilities by multiplying the first set of hidden values with the second set of synapse weights and summing a first set of normalized node values;

comparing the set of output interpretation probabilities to the set of known interpretation probabilities;

calculating an error in the set of output interpretation probabilities due to the first set of synapse weights;

calculating an error in the first set of hidden values due to the second set of synapse weights;

adjusting the first set of synapse weights to create a third set of synapse weights; and, adjusting the second set of synapse weights to create a fourth set of synapse weights to produce a trained artificial neural network.

9. The system of claim 8 wherein the step of generating the set of interpretation probabilities further comprises:

appending the set of test parameters to the set of resistivity data to form a second column matrix;

calculating, by the trained artificial neural network, a second set of hidden values for the hidden layer by multiplying the second column matrix by the third set of synapse weights and normalizing; and, calculating, by the trained artificial neural network, the set of interpretation probabilities by multiplying the second set of hidden values with the fourth set of synapse weights and summing a second set of normalized node values.

10. A method for interpreting resistivity data comprising:

providing a system server;

providing a processor in the system server;

providing a memory operatively connected to the processor;

the memory, including a set of instructions that, when executed, causes the system server to perform the steps of:

receiving a set of resistivity data; and, generating a set of interpretation probabilities from the set of resistivity data;

instantiating a convolutional neural network;

deriving a training set of interpretation probabilities from the convolutional neural network;

instantiating an artificial neural network;

training the artificial neural network with the training set of interpretation probabilities;

receiving a set of test parameters associated with the set of resistivity data; and, generating the set of interpretation probabilities from the set of resistivity data and the set of test parameters.

11. The method of claim 10 further comprising choosing the set of test parameters from at least one of the group of longitude, latitude, weather, array type, soil type, current, voltage, humidity, and soil moisture.

12. The method of claim 10 further comprising the step of providing a graphics generator resident on the system server, and the set of instructions further comprises instructions that when executed cause the system server to perform the steps of:

generating, by the graphics generator, a resistivity map based on the set of resistivity data.

13. The method of claim 12 further comprising:

providing a convolutional neural network, resident on the system server, comprised of:

an image input layer, having a first set of nodes, corresponding to the resistivity map;

a convolutional layer, having a set of extracted feature maps, connected to the image input layer;

a pooling layer, having a set of compressed feature maps corresponding to the set of extracted feature maps, connected to the convolutional layer;

an input layer, having a second set of nodes, corresponding to a number of values in the set of compressed feature maps and the set of test parameters, connected to the pooling layer;

a hidden layer, having a third set of nodes, connected to the input layer; and, an output layer, having a fourth set of nodes, corresponding to a set of values related to the set of interpretation probabilities, connected to the hidden layer.

14. The method of claim 13 wherein the step of generating the set of interpretation probabilities further comprises training the convolutional neural network by the steps of:

receiving a training resistivity map having a plurality of training image pixels;

receiving a training set of test parameters;

receiving a set of known interpretation probabilities associated with the training resistivity map;

setting a first set of values for a first set of synapse weights;

setting a second set of values for a second set of synapse weights;

moving a first local window across a first plurality of sub-regions of the training resistivity map to obtain a first plurality of sub-region pixel sets associated with each extracted feature map of the set of extracted feature maps;

moving a second local window across a second plurality of sub-regions of the set of extracted feature maps to obtain a second plurality of sub-region pixel sets associated with each compressed feature map of the set of compressed feature maps;

translating the set of compressed feature maps into a first column matrix;

appending the training set of test parameters to the first column matrix;

calculating a first set of hidden values for the hidden layer by multiplying the first column matrix by the first set of synapse weights and normalizing;

calculating a set of output interpretation probabilities by multiplying the first set of hidden values with the second set of synapse weights and summing a first set of normalized node values;

comparing the set of output interpretation probabilities to the set of known interpretation probabilities;

calculating an error in the set of output interpretation probabilities due to the first set of synapse weights;

calculating an error in the first set of hidden values due to the second set of synapse weights;

adjusting the first set of synapse weights to create a third set of synapse weights; and, adjusting the second set of synapse weights to create a fourth set of synapse weights to produce a trained convolutional neural network.

15. The method of claim 14 wherein the step of generating the set of interpretation probabilities further comprises the steps of:

moving a third local window across a third plurality of sub-regions of the resistivity map to obtain a third plurality of sub-region pixel sets associated with each extracted feature map of the set of extracted feature maps;

moving a fourth local window across a fourth plurality of sub-regions of the set of extracted feature maps to obtain a fourth plurality of sub-region pixel sets associated with each compressed feature map of the set of compressed feature maps;

translating the set of compressed feature maps into a second column matrix;

appending the set of test parameters to the second column matrix;

calculating, by the trained convolutional neural network, a second set of hidden values for the hidden layer by multiplying the second column matrix by the third set of synapse weights and normalizing; and, calculating, by the trained convolutional neural network, the set of interpretation probabilities by multiplying the second set of hidden values with the fourth set of synapse weights and summing a second set of normalized node values.

16. The method of claim 10 further comprising:

providing an artificial neural network, resident on the system server, comprised of:

an input layer having a first set of nodes corresponding to the set of resistivity data and the set of test parameters;

a hidden layer, connected to the input layer by a first set of synapses, having a second set of nodes; and, an output layer, connected to the hidden layer by a second set of synapses, corresponding to the set of interpretation probabilities.

17. The method of claim 16 wherein the step of generating the set of interpretation probabilities further comprises the step of training the artificial neural network by:

receiving a set of training resistivity data;

receiving a set of training test parameters associated with the resistivity data;

receiving a set of known interpretation probabilities for the set of training resistivity data and the set of training test parameters;

appending the set of training test parameters to the set of training resistivity data to form a first column matrix;

setting a first set of values for a first set of synapse weights, corresponding to the first set of synapses;

setting a second set of values for a second set of synapse weights, corresponding to the second set of synapses;

calculating a first set of hidden values for the hidden layer by multiplying the first column matrix by the first set of synapse weights and normalizing;

calculating a set of output interpretation probabilities by multiplying the first set of hidden values with the second set of synapse weights and summing a first set of normalized node values;

comparing the set of output interpretation probabilities to the known set of known interpretation probabilities;

calculating an error in the set of output interpretation probabilities due to the first set of synapse weights;

calculating an error in the first set of hidden values due to the second set of synapse weights;

adjusting the first set of synapse weights to create a third set of synapse weights; and, adjusting the second set of synapse weights to create a fourth set of synapse weights to produce a trained artificial neural network.

18. The method of claim 17 wherein the step of generating the set of interpretation probabilities further comprises:

appending the set of test parameters to the set of resistivity data to form a second column matrix;

calculating, by the trained artificial neural network, a second set of hidden values for the hidden layer by multiplying the second column matrix by the third set of synapse weights and normalizing; and, calculating, by the trained artificial neural network, the set of interpretation probabilities by multiplying the second set of hidden values with the fourth set of synapse weights and summing a second set of normalized node values.

* * * * *